(12) United States Patent
Terunuma et al.

(10) Patent No.: US 6,921,869 B2
(45) Date of Patent: Jul. 26, 2005

(54) INTERLAYER CONNECTION STRUCTURE OF MULTILAYER WIRING BOARD, METHOD OF MANUFACTURING METHOD OF FORMING LAND THEREOF

(75) Inventors: Ichiro Terunuma, Yachiyo (JP); Kazuya Akashi, Tomisato (JP); Atsushi Momota, Ohta (JP)

(73) Assignee: Fujikura Ltd., Tokyo (JP)

( * ) Notice: Subject to any disclaimer, the term of this patent is extended or adjusted under 35 U.S.C. 154(b) by 9 days.

(21) Appl. No.: 10/223,396

(22) Filed: Aug. 20, 2002

(65) Prior Publication Data

US 2003/0056978 A1 Mar. 27, 2003

(30) Foreign Application Priority Data

| Sep. 26, 2001 | (JP) | ........................................ | 2001-293035 |
| Sep. 27, 2001 | (JP) | ........................................ | 2001-295586 |
| Oct. 31, 2001 | (JP) | ........................................ | 2001-334861 |

(51) Int. Cl.[7] ............................................... H05K 1/00
(52) U.S. Cl. ........................ 174/256; 254/255; 254/262
(58) Field of Search ................................. 174/254, 256, 174/255, 262, 261, 117 F, 117 FF, 250; 361/803; 29/853, 831

(56) References Cited

U.S. PATENT DOCUMENTS

| 3,969,815 A | * | 7/1976 | Hacke et al. .................. 29/853 |
| 4,627,565 A | * | 12/1986 | Lomerson .................... 228/107 |
| 4,640,981 A | * | 2/1987 | Dery et al. ............... 174/88 R |
| 4,795,079 A | * | 1/1989 | Yamada .................... 228/179.1 |
| 5,003,126 A | * | 3/1991 | Fujii et al. ..................... 174/36 |
| 5,121,299 A | * | 6/1992 | Frankeny et al. ........... 361/785 |
| 5,744,758 A | * | 4/1998 | Takenouchi et al. ........ 174/255 |
| 6,197,407 B1 | * | 3/2001 | Andou et al. ............... 428/209 |
| 6,459,044 B2 | * | 10/2002 | Watanabe et al. ........... 174/254 |
| 6,459,046 B1 | * | 10/2002 | Ochi et al. .................. 174/256 |

FOREIGN PATENT DOCUMENTS

| JP | 6-208873 | 7/1994 |
| JP | 7-45342 | 2/1995 |

OTHER PUBLICATIONS

Yamamoto, Yukio, "100 F.F.C. (Flexible Flat Circuit) Development of th Flexible Flat Circuit –Application to Door Harness–" Nissan Motor Co., LTD., pp. 65–67

Yamamoto, Yukio et al., "F.F.C. (Flexible Flat Circuit) Development of the Flexible Flat Circuit and Application to Automobiles", vol. 50, No. 2, 1996, pp. 77–80.

Mottate, A. "Development of Automotive New Wiring Harness "FFC"", pp. 15–20.

* cited by examiner

*Primary Examiner*—David L. Talbolt
*Assistant Examiner*—I B Patel
(74) *Attorney, Agent, or Firm*—Sughrue Mion, PLLC

(57) ABSTRACT

A conductive pattern made of copper foil is formed on a base material in each of a plurality of laminated flexible printed circuit boards, and a land is formed to expose the conductive pattern at a predetermined position in the base material. The plurality of flexible printed circuit boards are laminated to adjust each land, and the conductive pattern of each flexible printed circuit board is connected through the each land.

1 Claim, 20 Drawing Sheets

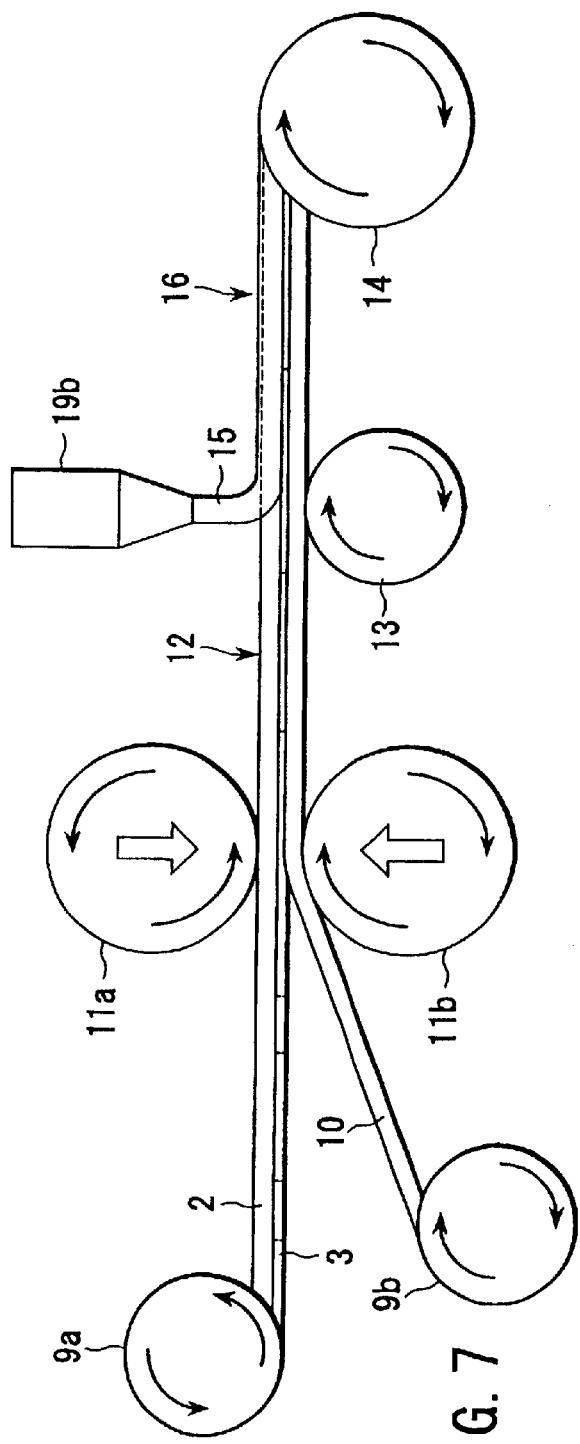
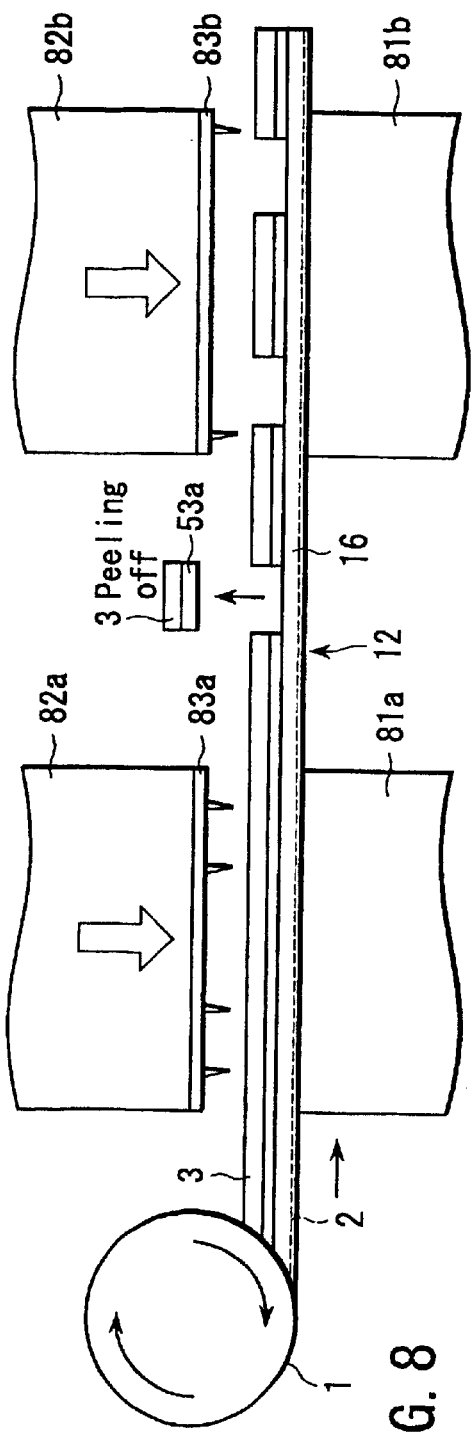
FIG. 7
FIG. 8

INTERLAYER CONNECTION STRUCTURE OF MULTILAYER WIRING BOARD, METHOD OF MANUFACTURING METHOD OF FORMING LAND THEREOF

CROSS-REFERENCE TO RELATED APPLICATIONS

This application is based upon and claims the benefit of priority from the prior Japanese Patent Applications No. 2001-293035, filed Sep. 26, 2001; No. 2001-295586, filed Sep. 27, 2001; and No. 2001-334861, filed Oct. 31, 2001, the entire contents of all of which are incorporated herein by reference.

BACKGROUND OF THE INVENTION

1. Field of the Invention

The present invention relates to a flexible printed circuit board (FPC), and more particularly, to an interlayer connection structure of a multiplayer wiring board, which permits manufacturing of FPC at low cost with the equivalent performance to FPC with a conductive pattern formed by etching and which permits forming of land at a desired position to connect each board of a multiplayer wiring board made by laminating a plurality of flexible printed circuit boards, and a method of manufacturing a flexible printed circuit board, and a method of forming a land thereof.

2. Description of the Related Art

Current modular design trend in electrical equipment for motor vehicles spreading in Europe and America has advanced from an assembly type module connecting already-existing units toward an integrated module combining the functions of each unit and accessory. The module structure will finally develop into amalgam in which units, and accessories and a wire harness connecting them are integrated in a single-piece structure. For realizing such a module structure, a flexible printed circuit board (FPC) is highly contributive. FPC permits mounting of units, accessories, switches and other circuit components, and is lightweight and enables high-density wiring. Therefore, FPC is considered the shortest way to the interlayer connection in an amalgam type module.

A flexible printed circuit board is usually configured as shown in FIGS. 35A to 35C attached hereto. That is, FPC 100 is constructed by that a conductive pattern 102 made of copper foil is laminated by adhesive 104 on a base material 101 composed of polyester film (PET), polyamide film (PI) or the like, and a cover lay 103 made of synthetic resign is coated on the base layer through adhesive 105 to protect and insulate the conductors.

FIGS. 36 and 37 are flow charts showing a processes of manufacturing the FPC 100. In a so-called pre-process, as shown in FIG. 36, a step of smoothing surface (S11) including cleaning the surface of a copper foil is performed first, and a dry film laminating step (S12) follows to laminate a copper foil and a dry film as a base material. This laminating step is a process of forming a so-called copper-clad laminate 200, in which a copper foil 106 is placed on a base material 101 with adhesive 104 coated thereon, and heated and pressed by work rolls 301a and 301b of a heat roller rolling on both sides, thereby the copper foil is heated, pressed, laminated, dried and cured, as shown in FIG. 38. To form a wiring pattern on the copper-clad laminate 200 produced through the above process, first the surface of the copper foil 106 is coated with a resist, and rendered to exposing (S13), developing (S14), modifying (S15) and etching (S16). A predetermined conductive pattern 102 is formed through these steps, and submitted to a final step of intermediate inspection (S17).

In a so-called post-process, the surface of the conductive pattern 102 is polished (S21), and a cover lay film is laminated (S22) to protect the surface. This cover lay film laminating step is a process of forming FPC 100, in which a cover lay film 103 with adhesive 105 coated underside thereof is placed on the copper-clad laminate 201 having a conductive pattern 102 formed thereon, and heated, pressed and adhered by work rolls 301a and 301b of a heat roller rolling on both sides, as shown in FIG. 39. Thereafter, the copper-clad laminate is cured at a predetermined temperature (S23), the portion of the conductive patter 102 not covered by a cover lay is plated (S24), for example, and rendered to punching (S25), trimming (S26), and blanking (S27), and submitted to a final step of products. The FPC 100 is completed in this way.

However, the above described prior art method of manufacturing FPC needs etching to form a copper-clad laminate 200. This increases the number of manufacturing steps, decreases the yields of materials, and requires high cost of waste liquid disposing facilities. Thus, FPC itself becomes very expensive. Moreover, in cases when FPC is used for wiring of modules, a copper foil with a certain thickness must be used to meet a so-called medium-current circuit. Etching of a thick copper foil decreases reliability, and increases material and processing costs. Therefore, it will result in increased cost to merely use FPC instead of the wiring used in current modules. This has been a problem in using FPC for wiring of modules. Furthermore, when FPC is used as a harness or joint box in motor vehicles, a large current value in a circuit requires a copper foil with the thickness larger than a predetermined value. Generally, thicker the copper foil, the material cost will become high, and the total production cost will rise. This is another problem in using FPC. In addition, If FPC is produced by etching, a thicker copper foil requires longer etching time, and the processing cost will rise. Especially, if FPC for use in a large-current circuit is produced by a method including etching as described above, increase in cost will become serious.

Further, when FPC 100 is applied to a joint box, for example, usually a plurality of FPCS are laminated to form a multiplayer wiring board and the board is contained in a joint box, and interlayer connection to connect each layer will be necessary. However, in FPC, a base material 101 and a cover lay 103 are adhered to a conductive pattern 102 from the bottom and top thereof, respectively, and it will be necessary to make a land 106 for interlayer connection outside a circuit 107, as shown in FIG. 40A, and connect only the conductive patterns 102 by eliminating a base material 101 and cover lay 103, as shown in FIG. 40B. Thus, the dimension of FPC 100 circuit will be inevitably long. This is still another problem in the prior art method of manufacturing FPC.

BRIEF SUMMARY OF THE INVENTION

An object of the present invention is to provide an interlayer connection structure of a multiplayer wiring board which permits manufacturing of FPC at low cost for use in a large-current circuit, producing of a reliable land at low cost and forming a land for interlayer connection at a desired position without increasing the dimension of a multiplayer wiring board, and a method of manufacturing a flexible printed circuit board.

An aspect of the invention relates to an interlayer connection structure of a multiplayer wiring board comprising a base material, a plurality of laminated flexible printed circuit boards, a conductive pattern made of copper foil formed on the base material, and a land formed at a predetermined position on the base material to expose the conductive pattern, wherein the plurality of flexible printed circuit boards are laminated to adjust each land, and the conductive pattern of the each flexible printed circuit board is connected through the each land.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

FIG. 7 is schematic side view explaining another step of the FPC manufacturing process.

FIG. 8 is schematic side view explaining another step of the FPC manufacturing process.

DETAILED DESCRIPTION OF THE INVENTION

Hereinafter preferred embodiments of the present invention will be explained with reference to the accompanying drawings.

Figure 1A:
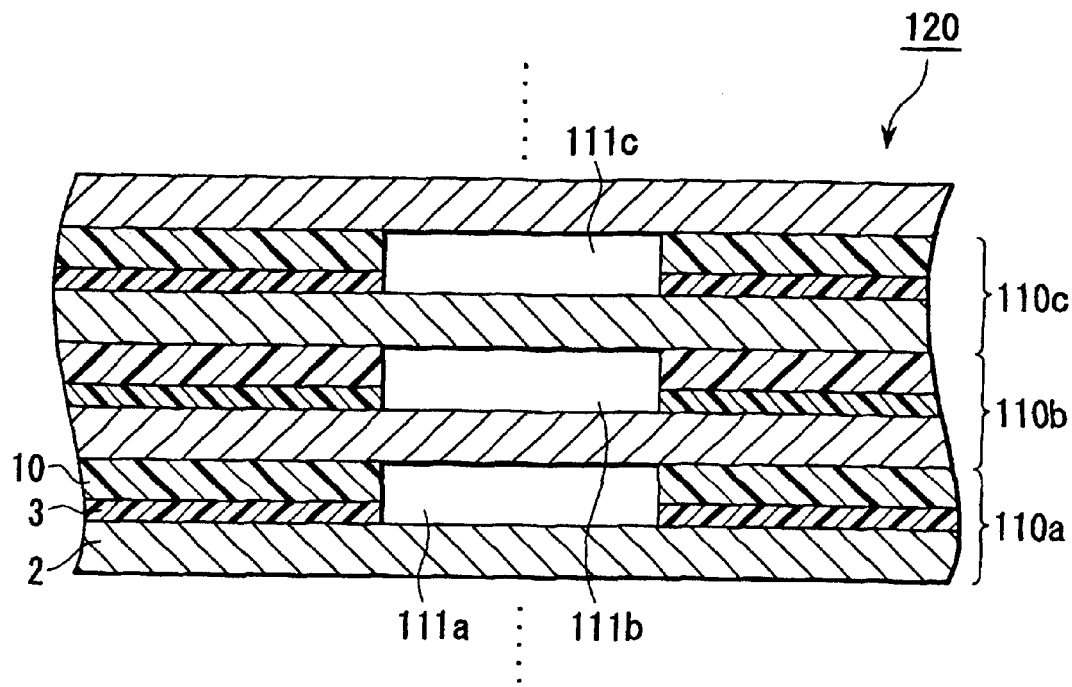
FIGS. 1A and 1B are longitudinal section views showing an interlayer connection structure of a multiplayer wiring board according to one embodiment of the present invention.
Figure 1B:
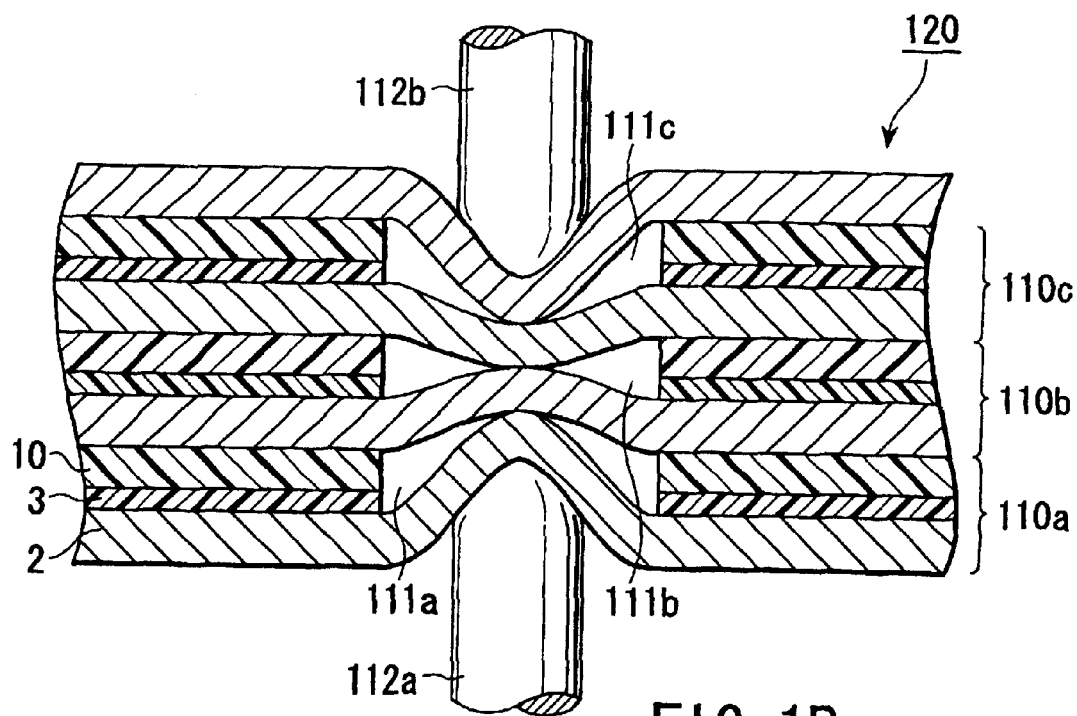

FIGS. 1A and 1B are longitudinal section views showing a interlayer connection structure of a multilayer printed wiring board according to one embodiment of the present invention.

As shown in FIG. 1A, at a predetermined position of each FPC 110 (110a, 110b, 110c) formed by laminating a base film 10 on a copper foil 2 through a hot melt resin 3, a land 111 (111a, 111b, 111c) is formed as a hole to expose the copper 2 to the base film 10 side by removing the base film 10 and hot melt resin 3. A multilayer printed wiring board 120 is formed by aligning the lands 111a–111c and laminating FPCs 110a–110c.

For making interlayer connection, copper foils 2 are welded in lands 111 by applying welding electrodes 112a and 112b from the top and bottom sides, as shown in FIG. 1B. Various welding techniques may be used, for example, resistance welding, ultrasonic welding, laser welding, soldering and so on. When welding is not used, it is possible to connect copper foils 2 by filling conductive adhesive, for example, in lands 111a–111c. In this interlayer connection structure, as lands 111a–111c can be formed at any desirable position in the circuit composed of conductive patterns of each FPC 110, it is not necessary to make lands for interlayer connection exposed from a circuit, and the dimension of each FPC 100 circuit can be freely designed.

FPC 100 having such a land 111 can be manufactured by a method described hereinafter.

Figure 2:
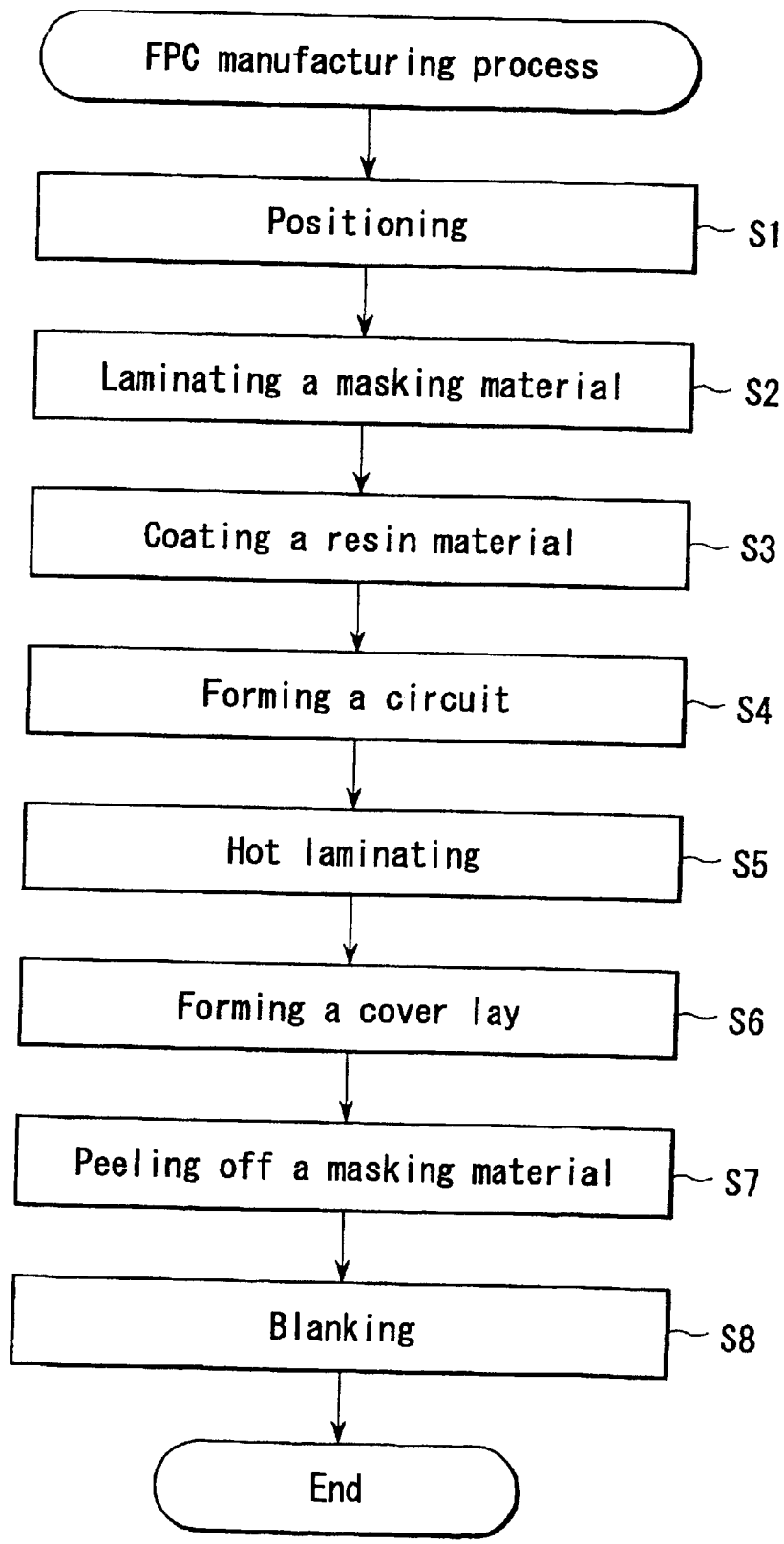
FIG. 2 is a flow chart showing a process of manufacturing a flexible printed circuit board (FPC) according to one embodiment of the invention.
Figure 3:
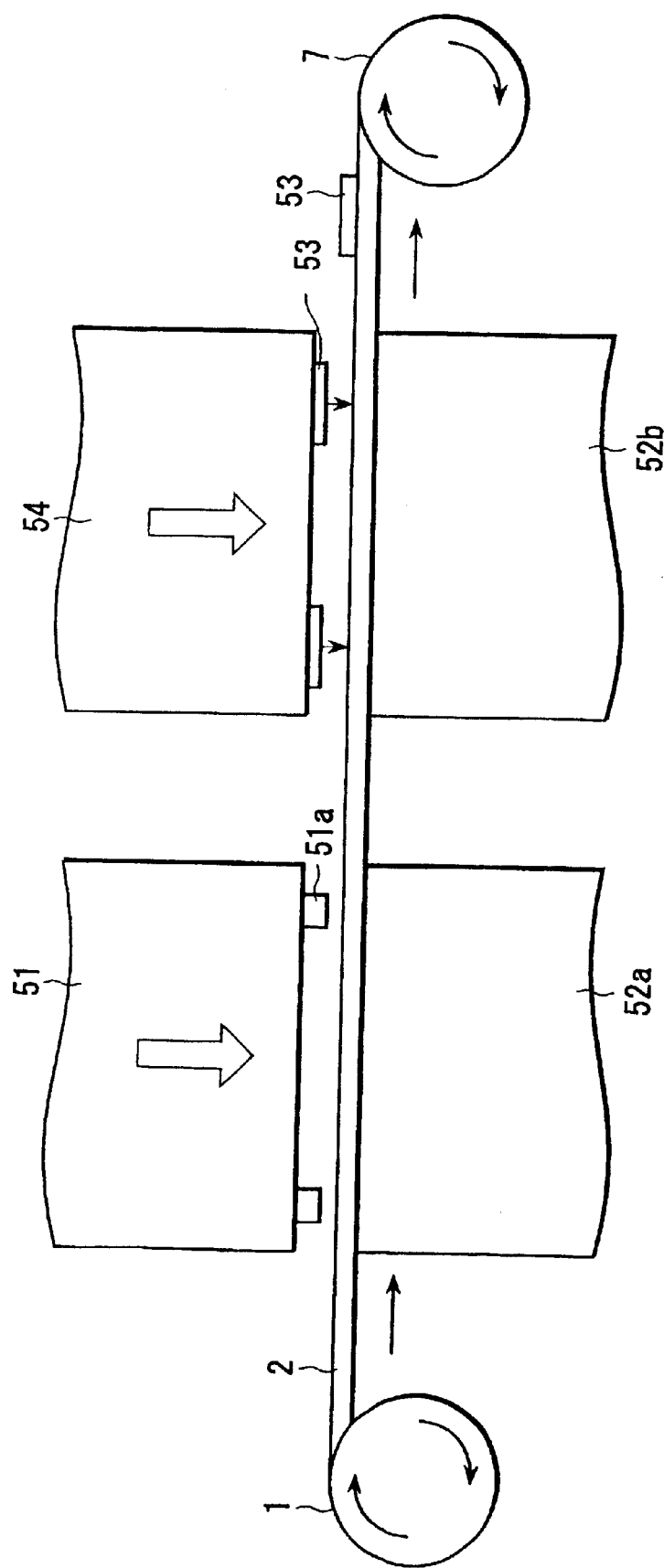
FIG. 3 is a schematic side view explaining a step of said FPC manufacturing process.
Figure 4:
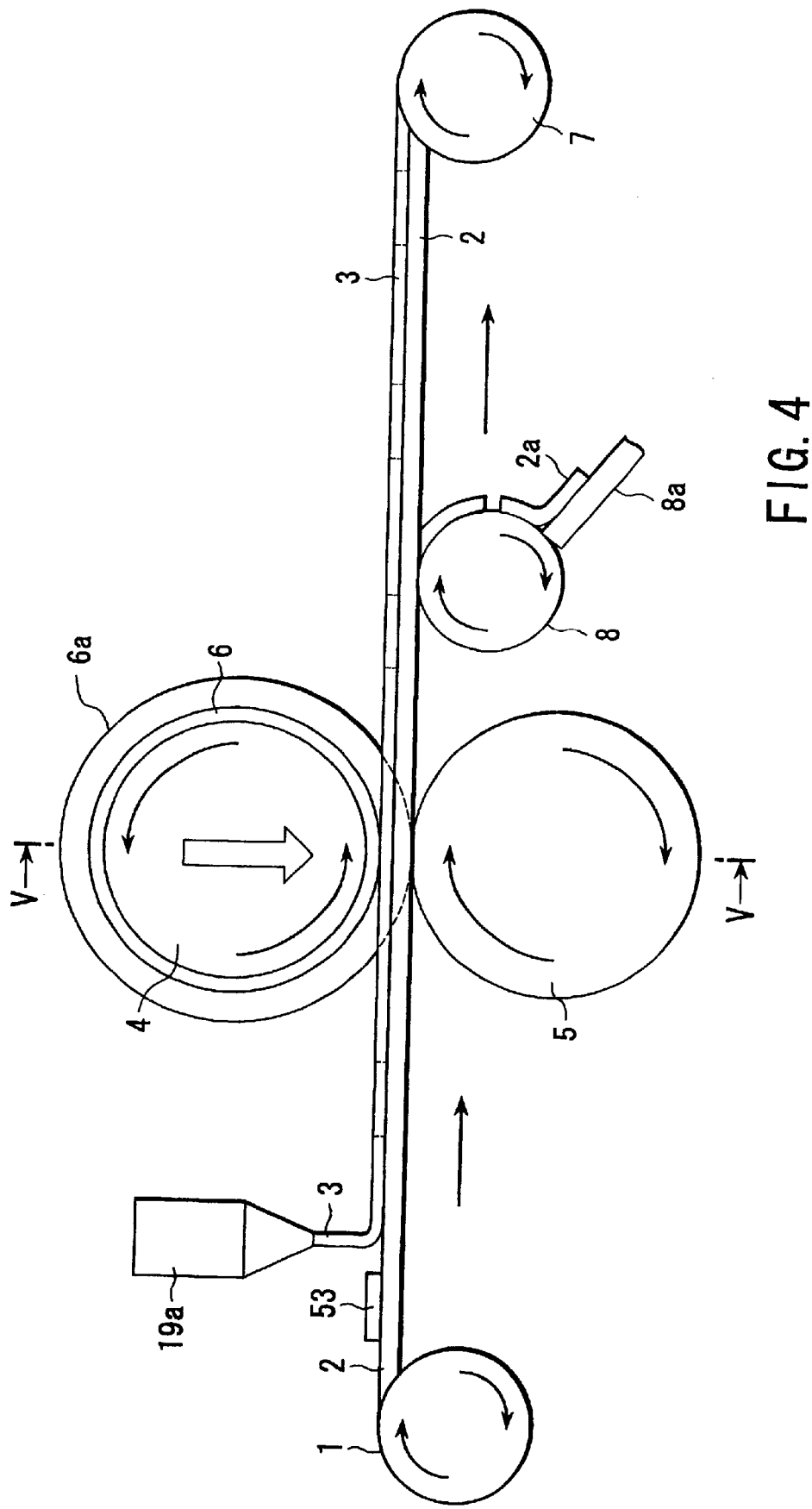
FIG. 4 is a schematic side view explaining another step of the FPC manufacturing process.
Figure 5:
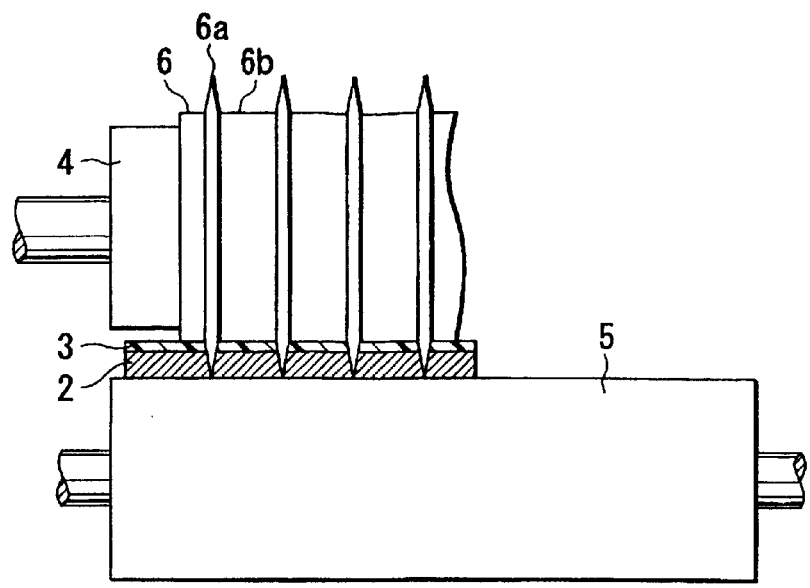
FIG. 5 is an V—V arrow view of FIG. 4.
Figure 6:
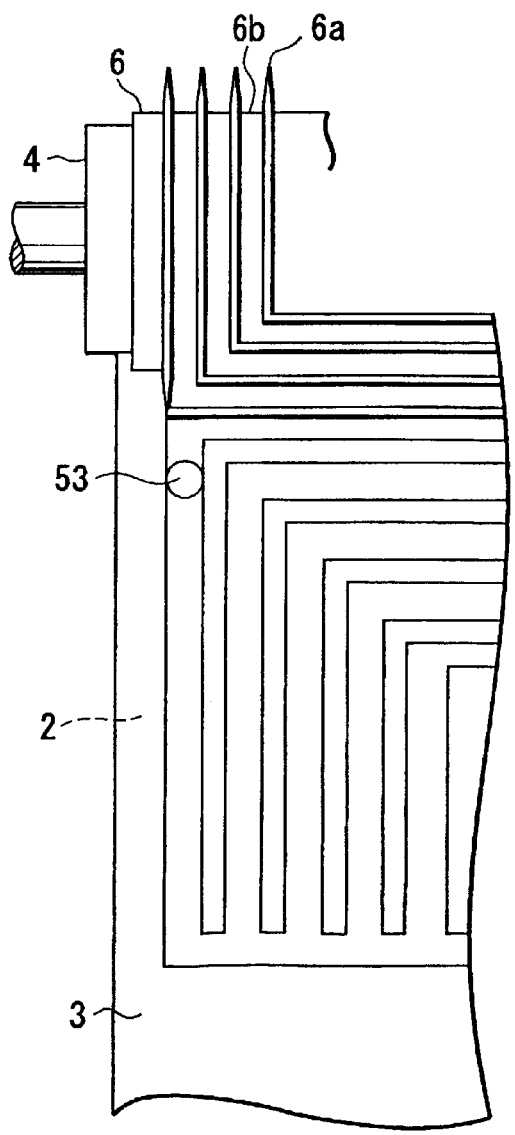
FIG. 6 is a top plane view of FIG. 4.

FIG. 2 is a flow chart showing a process of manufacturing a flexible printed circuit board according to one embodiment of the invention. FIG. 3 and FIG. 4 are schematic side views explaining steps of the manufacturing process of FIG. 2. FIG. 5 is an IV—IV arrow view (partially cross section) of FIG. 4. FIG. 6 is a top plane view of FIG. 4. FIG. 7 and FIG. 8 are schematic side views explaining another steps of the manufacturing process of FIG. 2.

Firstly, as shown in FIG. 3, a copper foil 2 wound around a supply roll 1 is unrolled and led to between a work head 51 and a work table 52a of a press machine (not shown) for example, and pressed by the work head 51 in the outline arrow direction, and opened by a punch 51a a plurality of positioning holes, explained later, at predetermined positions (S1). A copper 2 is, for example, rolled copper foil or electroplated copper foil, and the thickness thereof is over 100 $\mu$m and below 150 $\mu$m in case of rolled type while below 70 $\mu$m in case of electroplated type.

Secondary, the copper foil 2 with a positioning holes is led to between a work head 54 and a work table 52b, where a masking material 53 is formed by the work head 54 at a position on the copper foil 2 to form a land (S2). As a masking material 53, paper, resign or metal tape coated with adhesive of weak adhesion power to a copper foil 2 is preferable. A masking material 53 may otherwise be formed by screen printing with masking ink. Further, use of a masking device such as a chip mounter will semi-automate the masking step. Printing of mold lubricant is also permitted as a masking material 53. The copper foil 2 is laminated to a masking material 53 on its predetermined position in this way, and is taken up in a take-up roll 7.

Thirdly, as shown in FIG. 4, a copper foil 2 is unrolled from a supply roll 1, and hot melt resin 3 is supplied as a resin member from a thermoplastic resin discharge head 19a of a hot melt applicator (not shown) and applied to the masking material 53 laminated side of a copper foil 2 (S3). A hot melt resign 3 may be replaced by resin of polyamide, polyolefin or polyester group.

After being coated with the hot melt resin 3, the copper foil 2 is fed to between a work roll 5 and a magnet cylinder 4 with a rotating die, where a conductive patter is formed together with the hot melt resin 3 with a cutter 6a of a sheet-like pinnacle die 6 as a flexible die (S4). The magnet cylinder 4 with a die is cylindrical, as shown in FIG. 5, and comprises a powerful magnet, and has a pinnacle die 6 wound around the periphery as a flexible die having a cutter 6a and groove 6b comprising a projection or a projected stripe which extend in the peripheral direction and rectangular thereto, for example, to meet the conductive pattern to be formed. The pinnacle die 6 has grooves 6b and sharp cutter 6a formed on a sheet-like metal by etching and subsequent grinding or cutting. With this construction of pinnacle die 6, each time the magnet cylinder 4 with a die rotates, a desired conductive pattern and a circuit including a bridge connecting the conductive pattern can be continuously formed, as shown in FIG. 6.

The copper foil 2, with the conductive pattern formed by cutting as above described and the bridge connecting the conductive pattern, is taken up in the take-up roll 7, and the unnecessary copper portion 2a, formed also by cutting, is taken up in a take-up roll 8 whose periphery is coated with adhesive, and separated from the roll 8 by a squeegee 8a, and recovered for reuse.

Fifthly, as shown in FIG. 7, a copper foil 2 with a conductive pattern and bridge and a base film 10 made of polyethylene terephtalate (PET) are unrolled from supply rolls 9a and 9b, respectively, and laminated through the hot melt resign 3 inserted there-between and fed in this state to between work rolls 11a and 11b of a heat roller, where they are heat, pressed and adhered as indicated by the outline arrow in FIG. 7, that is, they are heat laminated (S5).

After the base film 10 is laminated, the copper foil 2 is conveyed as a copper-clad laminate 12 by a conveying roll 13. During the conveying process, a hot melt resign 15 is discharged from a thermoplastic resign discharge head 19b of a hot melt applicator (not shown) and applied to the copper foil 2 side of the copper-clad laminate 12, forming a cover lay 16 to protect the copper foil 2 (S6). As a hot melt resign 15 used in forming a cover lay, resin of polyurethane, polyamide, polyolefin or polyester group is preferable. After the cover lay 16 is formed, the copper-clad laminate 12 is taken up in the take-up roll 14.

Next, as shown in FIG. 8, the copper-clad laminate 12 is unrolled from a supply roll 1, conveyed onto a work table 81a of a press machine, and a base film 10 on a masking material 53 is cut off by a press machine 82a provided with a cutter 83a, and peeled of together with the masking material 53 (S7). Further, the copper-clad laminate 12 is conveyed onto a working table 82b of another press machine, where the part of the base film 3 peeled off with the masking material 53, including a bridge, is cut out with a press machine 82b provided a cutter 83b, and FPC is completed (S8).

Figure 9:
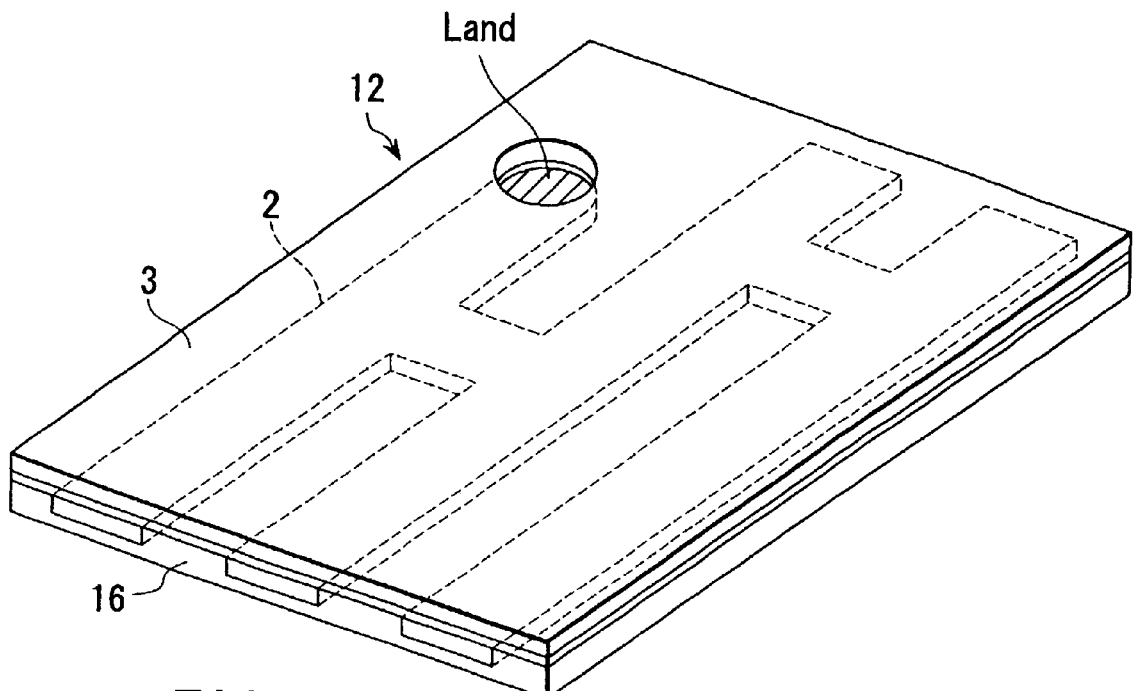
FIG. 9 is an external view of FPC manufactured by the FPC manufacturing process.

An FPC produced in this manner has a hole when laminated in the base film 3 of a land where copper foils 2 are connected, and a copper foil 2 is exposed, as shown in FIG. 9. Such a FPC is piled up to be layered, a copper 2 of the land is welded, as explained referring to FIG. 1, whereby the layers of a multilayer wiring board are connected.

By the method described above, a conductive pattern can be formed by cutting a copper foil with a magnet cylinder 4 with a die, without using a large die or press machine. Thus, a flexible printed circuit board can be continuously manufactured in a short time. This eliminates the cost of disposing waste liquid, which is required when a conductive pattern is formed by etching. Thus, the manufacturing costs can be reduced, and the die depreciation cost can also be reduced by using a die producible at low cost. Moreover, while the conductor (copper foil) thickness is limited in a conductive pattern formed by etching, a thick conductor can be cut by this method, and FPC applicable to a large-current circuit can be easily manufactured.

In addition, by this method, a land for connecting each layer of a multilayer wiring board can be formed at a desired position in an FPC circuit, and the dimension of FPC circuit can be regulated to optimum, and the manufacturing costs will become low.

Figure 10:
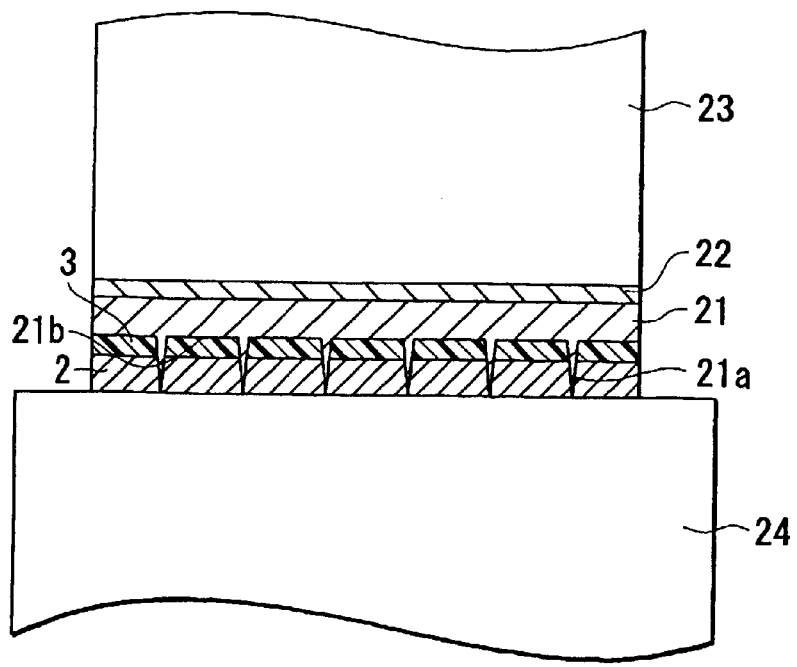
FIG. 10 is a X—X sectional view of FIG. 11.
Figure 11:
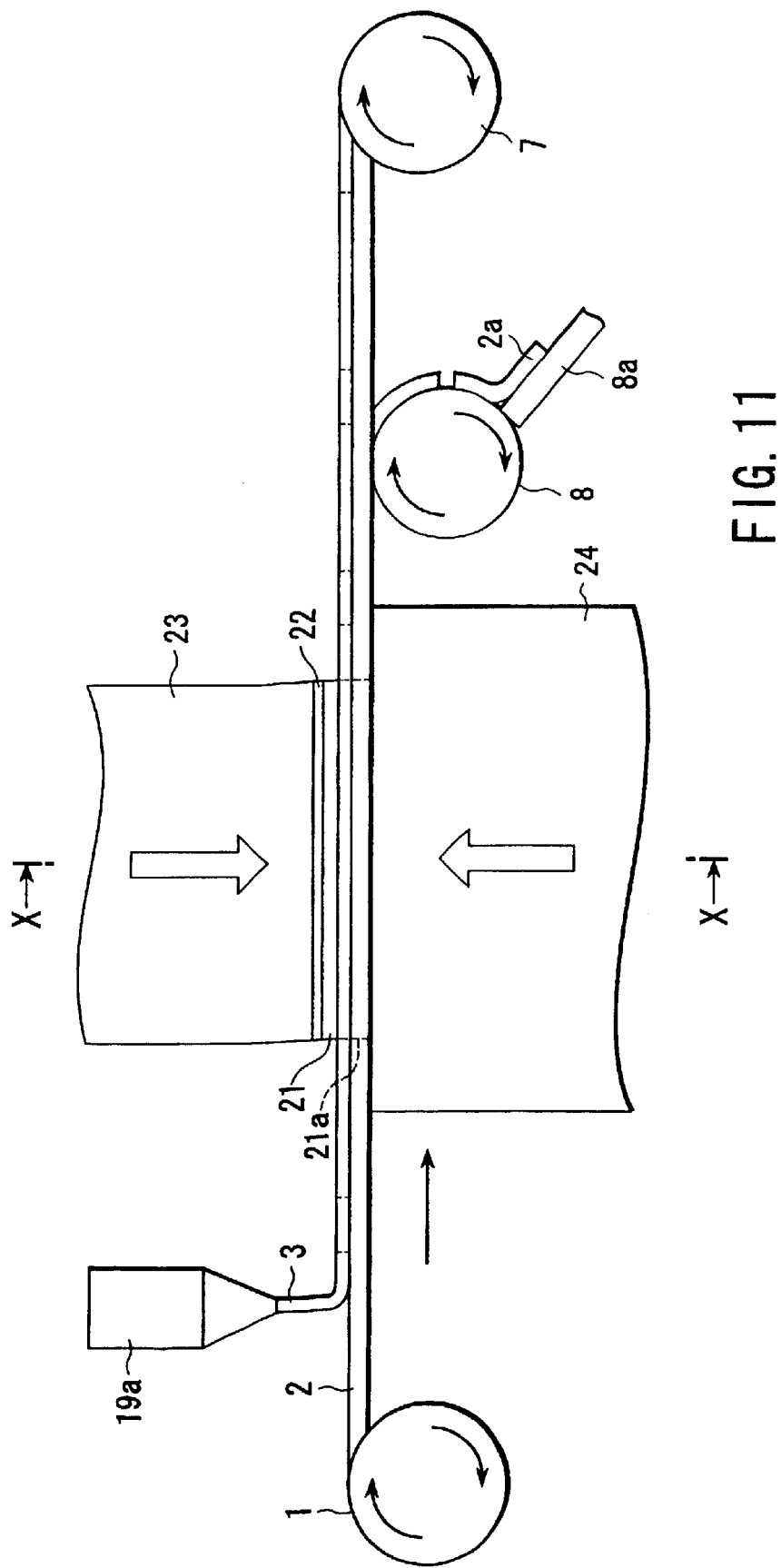
FIG. 11 is a view illustrating a circuit forming method by punching which is a modification of the circuit forming step in the FPC manufacturing process.

Although a magnet cylinder 4 with a die is used to cut a conductive pattern on a copper foil 2 and a bridge in step 4, a Thomson die 21 with a Thomson cutter 21a may be used for the cutting, as shown in FIG. 11 and its X—X cross section FIG. 10. In this case, a Thomson die 21 is mounted on a die mounter 22 of a work head 23 of a press machine (not shown), and a copper foil 2 is cut by press work.

Figures 12, 16:
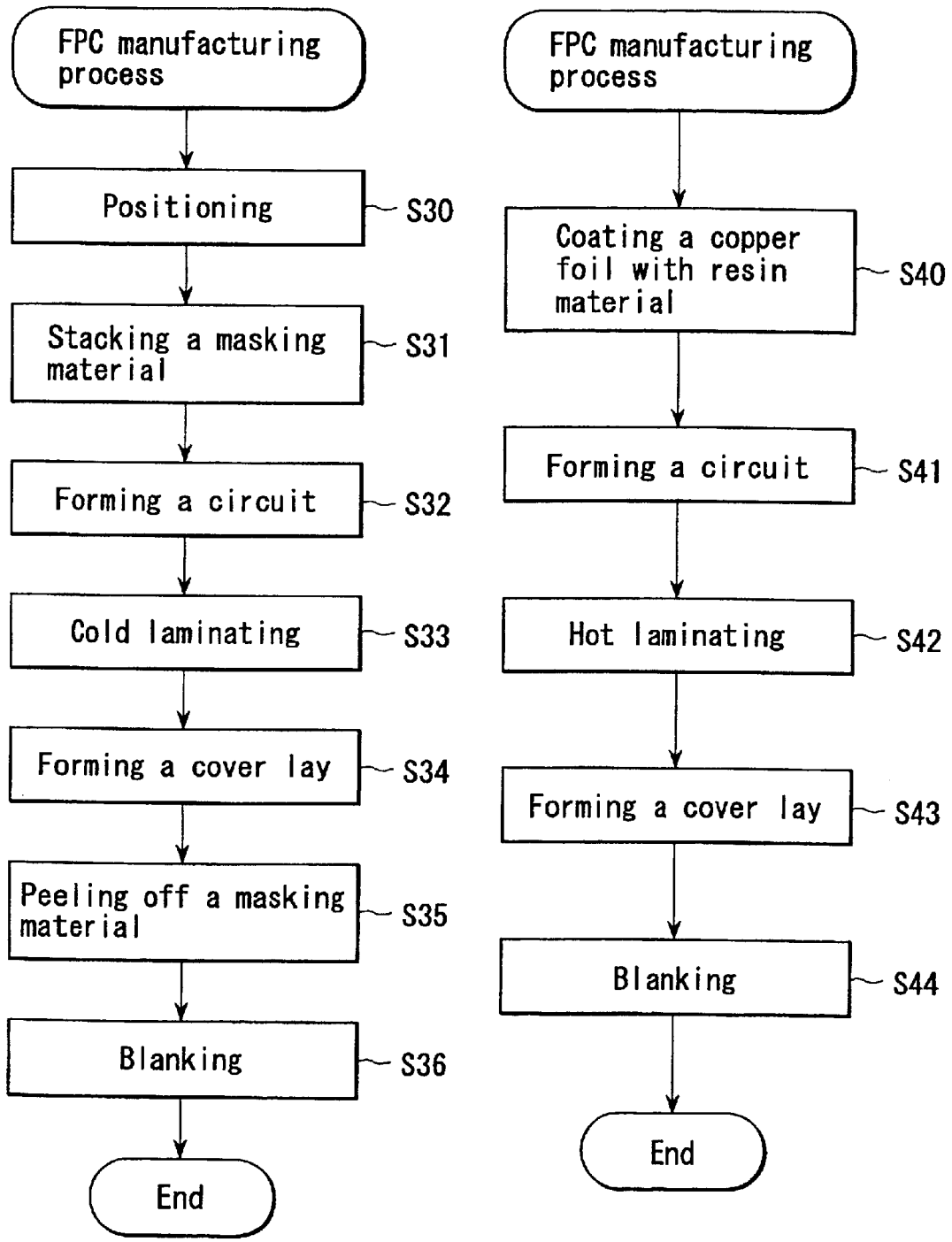
FIG. 12 is a flow chart showing process of manufacturing a flexible printed circuit board (FPC) according to another embodiment of the present invention.
FIG. 16 is a flow chart showing a process of manufacturing a flexible printed circuit board (FPC) according to sill another embodiment of the invention.
Figure 13:
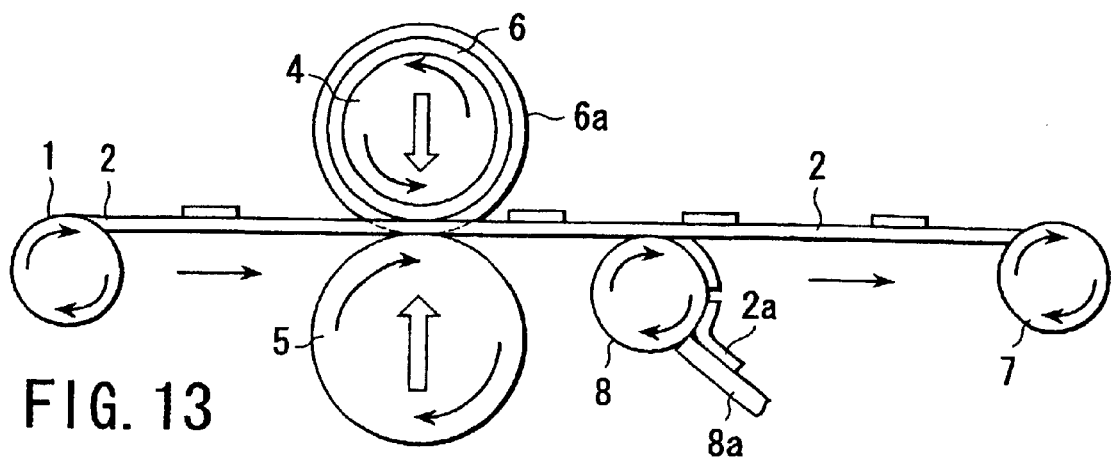
FIG. 13 is a schematic side view explaining a step of said FPC manufacturing process.
Figure 14:
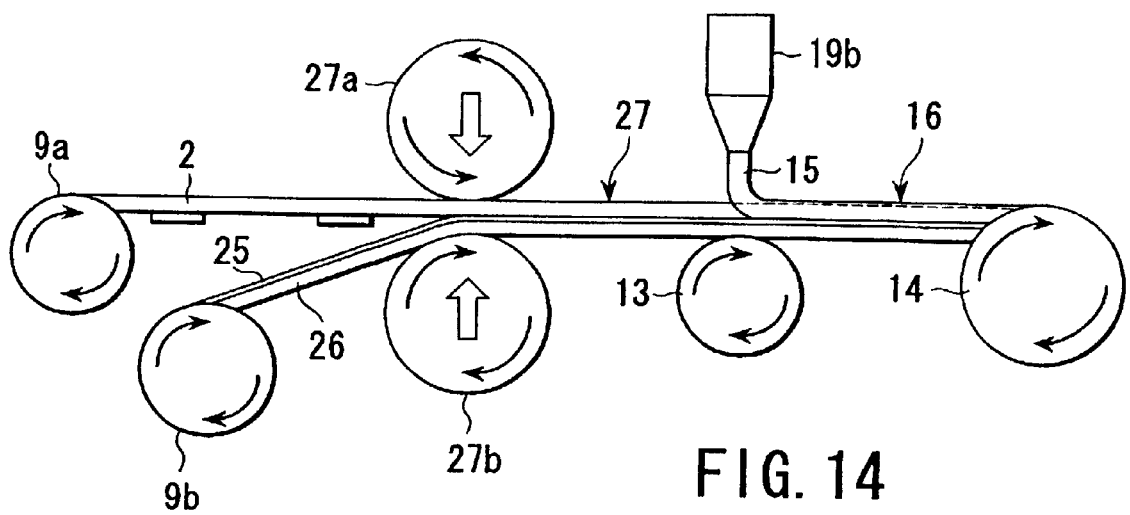
FIG. 14 is a schematic side view explaining another step of the FPC manufacturing process.

FIG. 12 is a flow chart showing a process of manufacturing a flexible printed circuit board according to another embodiment of the invention. FIG. 13 and FIG. 14 are schematic side views explaining steps of the manufacturing process. As in the first embodiment described hereinbefore with reference to FIG. 3, a copper foil 2 wound around a supply roll 1 is unrolled and led to between a work head 51 and a work table 52a of a press machine (not shown), for example, and pressed by the work head 51 in the white outline arrow direction, and a plurality of positioning holes are opened at predetermined positions by a punch 51a (S30).

Next, the copper foil 2 with the positioning holes opened is led to between a work head 54 and a work table 52b, where a masking material 53 is laminated by the work head 54 at a position on the copper foil 2 to form a land (S31). As a masking material 53, paper, resign or metal tape coated with adhesive of weak adhesion power to a copper foil 2 is preferable. In laminating the masking material 53, use of a masking device such as a chip mounter will semi-automate the masking step. The copper foil 2 with the masking material 53 laminated on its predetermined position is taken up in a take-up roll 7.

Next, as shown in FIG. 13, a copper foil 2 is unrolled from a supply role 1, and as in the first embodiment, the copper foil 2 is fed between a work roll 5 and a magnet cylinder 4 with a rotating die, where a conductive patter is formed together with a hot melt resin 3 with a cutter 6a of a pinnacle die 6 (S32). The copper foil 2, with the conductive pattern formed by cutting as above described and the bridge connected thereto, is taken up in a take-up roll 7, and the unnecessary copper portion 2a, formed also by cutting, is taken up in a take-up roll 8 whose periphery is coated with adhesive, and separated with a squeegee 8a, and recovered for reuse.

Next, as shown in FIG. 14, a copper foil 2 with a conductive pattern and bridge formed thereon and a base film 26 whose one side is previously coated with adhesive 25 are unrolled from supply rolls 9a and 9b, respectively, and laminated with the adhesive 25 of the base film 26 inserted there-between, and fed to between a work rolls 27a and 27b of a roll press (not shown), where they are heated, pressed and adhered as indicated by the outline arrow in the same drawing, that is, they are cold laminated (S33).

In this case, acryl, rubber and silicone may be used as adhesive 25. As a base film 26, resign made of polyethylene terephtalate (PET), polypropylene or vinyl chloride is optimum. In the cold laminating step, the adhesive 25 previously coated on one side of the base film 26 acts to adhere the copper the foil 2 to the base film 26.

After the base film 26 is cold laminated, the copper foil 2 is conveyed as a copper-clad laminate 27 by a conveying roll 13. During the conveying process, a hot melt resign 15 is discharged from a thermoplastic resign discharge head 19b of a hot melt applicator (not shown) and applied to the copper foil 2 side of the copper-clad laminate 27, forming a cover lay 16 (S34). After the cover lay 16 is formed, the copper-clad laminate 27 is taken up in the take-up roll 14.

And, as described above with reference to FIG. 8 of the first embodiment, a portion of the base film 26 on the masking material 53 is cut out, and peeled off together with the masking material 53 (S35). Further, the copper-clad laminate 27 is conveyed to another press machine, where blanking including a bridge is performed, and FPC is completed (S36).

By this second embodiment method, as in the first embodiment method, a flexible printed circuit board can be continuously manufactured within a short time. In addition, a land for connecting each layer of a multilayer wiring board can be formed at a desired position in an FPC circuit, and the dimension of FPC circuit can be regulated to optimum, and the manufacturing costs will become low.

Figure 15:
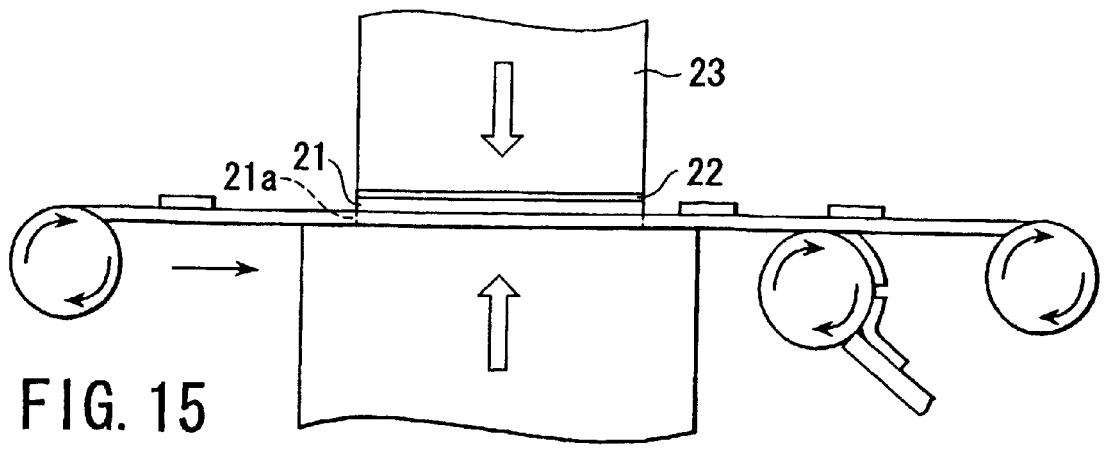
FIG. 15 is a view illustrating a circuit forming method by punching which is a modification of the circuit forming step in the FPC manufacturing process.

Although a magnet cylinder 4 with a die is used to cut a conductive patter on a copper foil 2 and a bridge in step 32, a Thomson die 21 with a Thomson cutter 21a may be used for the cutting, as shown in FIG. 15. In this case, a Thomson die 21 is mounted on a die mounter 22 of a work head 23 of a press machine (not shown), and a copper foil 2 is cut by press work.

Figure 17:
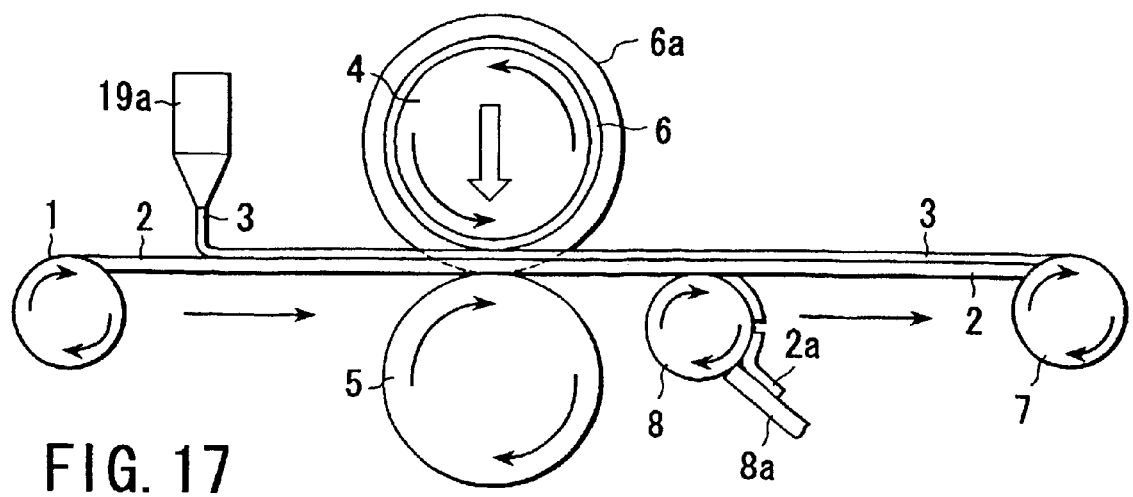
FIG. 17 is a schematic side view explaining a step of said FPC manufacturing process.
Figure 19:
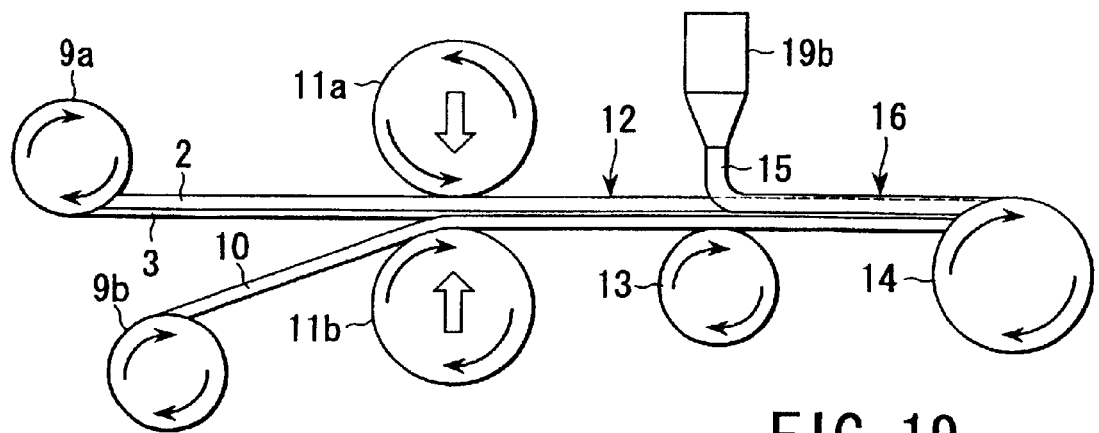
FIG. 19 is a schematic side view explaining a step of the FPC manufacturing process.
Figure 18:
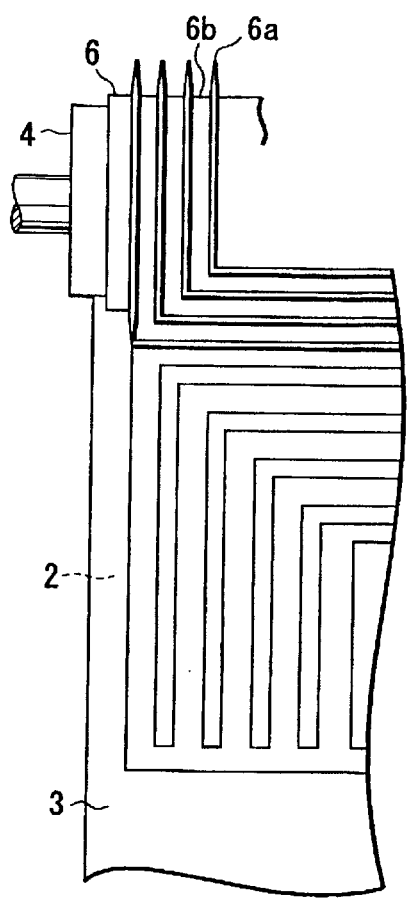
FIG. 18 is a top plane view of FIG. 17.

FIG. 16 is a flow chart showing a process of manufacturing a flexible printed circuit board according to still another embodiment of the invention. FIG. 17 is a schematic side view explaining steps of the manufacturing process of FIG. 16. FIG. 18 is a top plane view of FIG. 17. FIG. 19 is a schematic side view explaining steps of the manufacturing process of FIG. 16.

First, as shown in FIG. 17, a copper foil 2 is unrolled from a supply roll 1, and hot melt resin 3 is discharged, as a resin member, from a thermoplastic resin discharge head 19a of a hot melt applicator for example, (not shown) and applied to one side of the copper foil 2 (S40). As a copper foil 2, as described above, rolled copper foil or electroplated copper foil is preferable. The thickness of copper foil is preferably below 70 $\mu$m in case of electroplated copper foil, and over 100 $\mu$m and below 150 $\mu$m in case of rolled copper foil. As a hot melt resin 3, hot melt resin of polyamide, polypropylene or polyester group may be used. After being coated with the hot melt resin 3, the copper foil 2 is fed between a work roll 5 and a magnet cylinder 4 with a rotating die, where the copper coil is cut together with the hot melt resin 3 with a cutter 6a of a sheet-like pinnacle die 6 as a flexible die, to form a desired conductive pattern, and a circuit is formed (S41).

The magnet cylinder 4 with a die is, as mentioned above, cylindrical and comprises a powerful magnet, and has a pinnacle die 6 wound around and stuck to the periphery and having a cutter 6a and a groove 6b comprising at least one projection and projected stripe which extend in the peripheral direction and rectangular thereto, for example, to meet the conductive pattern to be formed. A pinnacle die 6 has a plurality of cutters 6a comprising a plurality of projected stripes formed at predetermined width and pitch on a sheet-like metal member by etching, for example, and the portions corroded by etching become grooves 6b. Since the cutters 6a are formed by grinding or cutting subsequent to etching, it is easy to form cutters 6a comprising a plurality of projected stripes extending in a desired direction, peripheral or axial, as shown in FIG. 18. This structure makes a pinnacle die 6 applicable to complicated circuit patterns. Besides, it is sufficient that the pinnacle die 6 has a cutter 6a and groove 6b corresponding to a transfer pattern when a desired conductive pattern is transferred onto the cutter forming surface of the pinnacle die 6. With this construction of pinnacle die 6, each time the magnet cylinder 4 with a die rotates, a desired conductive pattern and a circuit including a bridge can be continuously formed, and the productivity will be increased.

The magnet cylinder 4 with a die and work roll 5 rotates in the direction indicated by a solid line in FIG. 17, pressing a copper foil 2 coated with the hot melt resin 3 in the direction indicated by an outline arrow, and the copper foil 2 is cut by the cutter 8a of the pinnacle die 6. If the cutter 6a of the pinnacle die 6 is designed to leave a bridge to connect conductive patterns to be formed, a copper foil 2 will not be separated after being cut.

After being cut to form the conductive pattern and bridge as describe above, the copper foil 2 is taken up in the take-up roll 7, and the unnecessary copper portion 2a is taken up in a take-up roll 8 whose periphery, for example, is coated with adhesive, and separated from the take-up roll 8 with a squeegee 8a, and recovered for reuse.

Next, as shown in FIG. 19, a copper foil 2 with a conductive pattern and bridge formed thereon and a base film 10 made of polyethylene terephtalate (PET), for example, are unrolled from supply rolls 9a and 9b, respectively, and laminated through a hot melt resign 3 inserted there-between and fed to between a work rolls 11a and 11b of a heat roll system (not shown), where they are heated, pressed and adhered as indicated by the outline arrow in FIG. 19, that is, they are heat laminated (S42). In this heat laminating process, the hot melt resin 3 adhered to the copper foil 2 acts as an adhesive.

After the base film 10 is laminated, the copper foil 2 is conveyed as a copper-clad laminate 12 by a conveying roll 13. During the conveying process, a hot melt resign 15 is discharged from a thermoplastic resign discharge head 19b of a hot melt applicator (not shown) and applied to the copper foil 2 side of the copper-clad laminate 12, forming a cover lay 16 to protect the copper foil 2 (S43). As a hot melt resign 15 used in forming a cover lay, hot melt resin of polyurethane, polyamide, polyolefin or polyester group is preferable. After a cover lay 16 is formed, the copper-clad laminate 12 is taken up in the take-up roll 14. Finally, the copper-clad laminate 12 is fed to a press machine (not shown), where the blanking including a bridge is performed (S44), and a flexible printed circuit board is completed. A cover lay 16 is not necessarily be formed.

By the method described above, a conductive pattern can be formed by cutting a copper foil 2 with a magnet cylinder 4 with a die, without using a large die or press machine. Thus, a flexible printed circuit board can be continuously manufactured in a short time. This eliminates the cost of disposing waste liquid, which is required when a conductive patter is formed by etching. Thus, the manufacturing costs can be reduced, and the die depreciation cost can also be reduced by using a die producible at low cost. Moreover, while the conductor (copper foil) thickness is limited in a conductive pattern formed by etching method, a thick conductor can be cut by this method, and FPC applicable to a large-current circuit can be easily manufactured.

Figure 20:
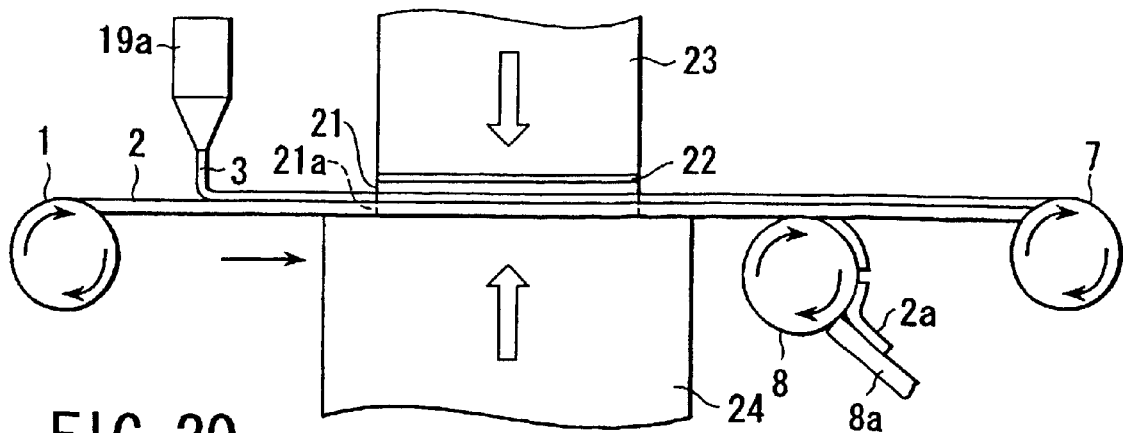
FIG. 20 is a view illustrating a circuit forming method by punching which is a modification of the circuit forming step in the FPC manufacturing process.

In the above steps 40 and 41, a magnet cylinder 4 with a die is used to cut a conductive patter on a copper foil 2 and a bridge. However, as shown in FIG. 20, a die (Thomson die) 21 with a so-called Thomson cutter 21a may be used for the cutting. In this case, a Thomson die 21 is mounted on a magnet-contained die mounter 22 of a work head 23 of a press machine (not shown), and a copper foil 2 is cut by press work.

In Thomson die 21 is, as described above, a plurality of cutters 21a and grooves 21b comprising a plurality of projected stripes extending in the predetermined direction to meet a plurality of conductive patterns to be formed, is formed with predetermined width and pitch on the metallic sheet member. In this case, a copper foil 2 is unrolled from a supply roll 1, a hot melt resin 3 is discharged from a discharge head 19a and applied to one side of the copper foil (S40) and fed to Thomson die 21, where the copper foil 2 is pressed in the outline arrow direction in FIG. 20 with a work head 23 and work table 24 of a press machine stuck to a die mounter 22, and the conductive pattern and bridge are cut, and a circuit is formed (S41). Steps after step 42 are basically the same as those described hereinbefore, and omitted here.

Figure 21:
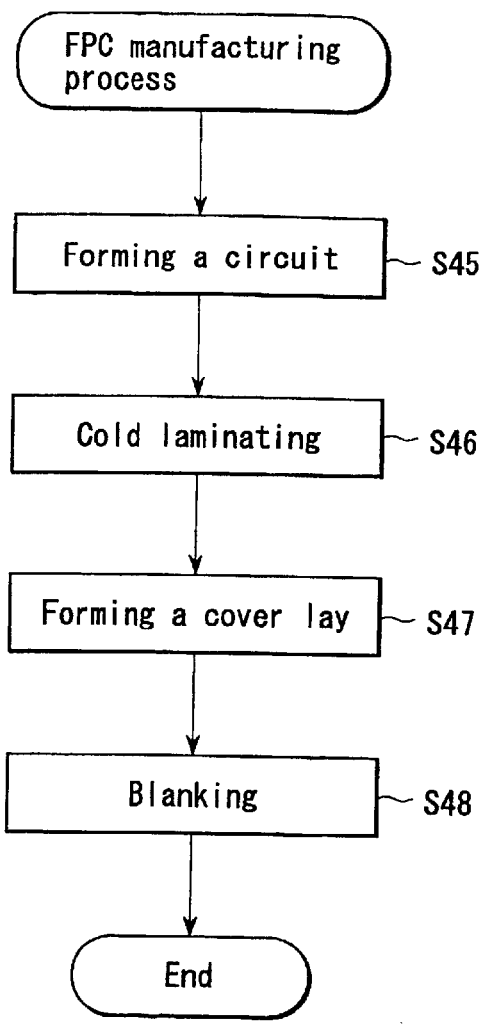
FIG. 21 is flow chart showing process of manufacturing a flexible printed circuit board (FPC) according to another embodiment of the invention.
Figure 22:
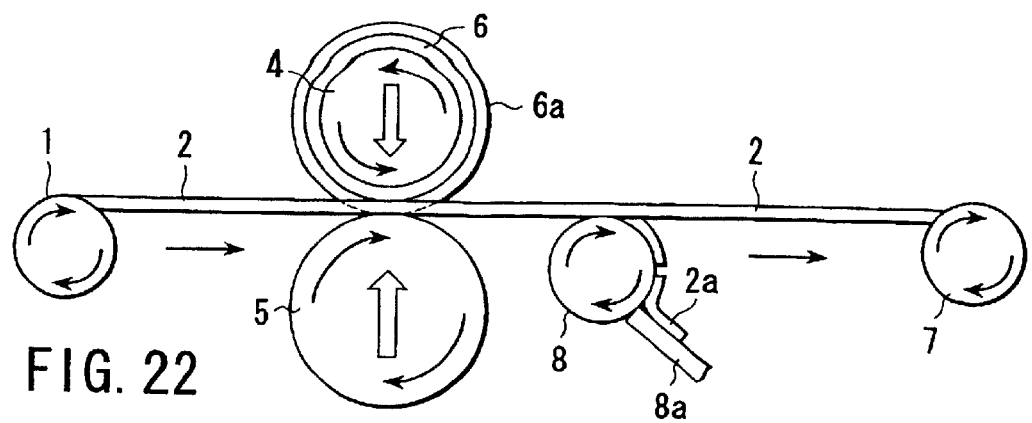
FIG. 22 is a schematic side view explaining a step of said FPC manufacturing process.
Figure 23:
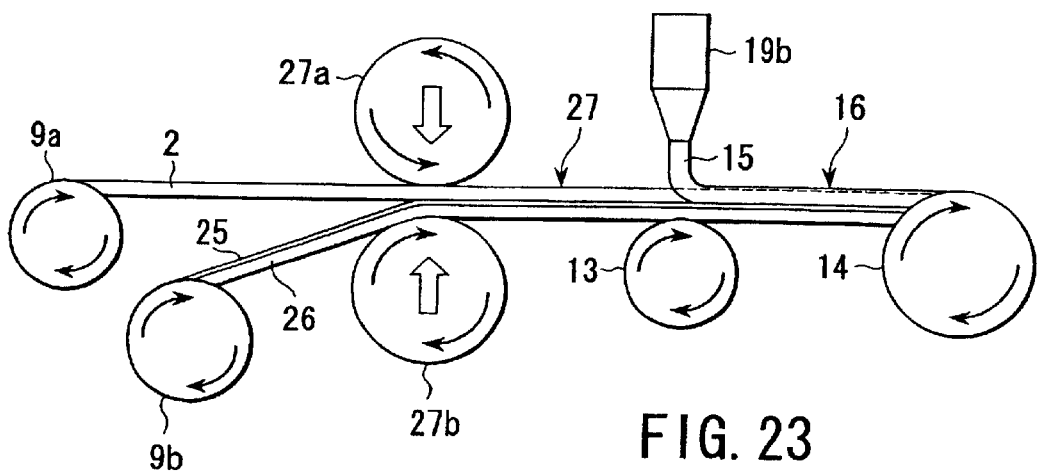
FIG. 23 is a schematic side view explaining another step of the FPC manufacturing process.

FIG. 21 is a flow chart showing a process of manufacturing a flexible printed circuit board according to another embodiment of the invention. FIG. 22 and FIG. 23 are schematic side views explaining steps of the manufacturing process of FIG. 22. The description overlapped with the previously description will be omitted.

First, as shown in FIG. 22, a copper foil 2 is unrolled from a supply roll 1, fed to between a rotating magnet cylinder 4 with a die and a work roll 5, where a desired conductive patter and bridge are cut with a cutter 6a of a sheet-like die (pinnacle die), and a circuit is formed (S45). The magnet cylinder 4 with a die and the work roll 5 rotate in the direction indicated by a solid line in FIG. 22, and the copper foil 2 is cut by the cutter 6a of the pinnacle die 6, and the conductive pattern and bridge portion of the copper foil 2 formed by cutting is taken up in the take-up roll 7. The residual copper portion 2a is taken up in a take-up roll 8, and separated from the take-up roll 8 with a squeegee 8a, and recovered for reuse.

Next, as shown in FIG. 23, a copper foil 2 with a conductive pattern and bridge formed thereon and a base film 26 whose one side is previously coated with adhesive 25 are unrolled from supply rolls 9a and 9b, respectively, and laminated with the adhesive 25 of the base film 26 inserted there-between and fed to between work rolls 27a and 27b of a roll press (not shown), where they are pressed and adhered by roll pressing as indicated by the outline arrow in the same drawing, that is, they are cold laminated (S46). In this case, acryl, rubber or silicone is preferable as adhesive 25. As a base film 26, resin made of polyethylene terephtalate (PET), polypropylene or vinyl chloride is optimum. In the cold laminating step, the adhesive 25 previously coated on one side of the base film 26 acts to adhere the copper foil 2 to the base film 26.

After the base film 26 is cold laminated, the copper foil 2 is conveyed as a copper-clad laminate 27 by a conveying roll 13. During the conveying process, a hot melt resign 15 is discharged from a thermoplastic resign discharge head 19b of a hot melt applicator (not shown), for example, and applied to the copper foil 2 side of the copper-clad laminate 27, forming a cover lay 16 (S47). After the cover lay 16 is formed, the copper-clad laminate 27 is taken up in the take-up roll 14. Finally, the copper foil 2 including a bridge is conveyed to another press machine (not shown), where blanking including a bridge is performed, and a flexible printed circuit board is completed. In this case, also, a cover lay 16 is not necessarily be formed.

Figure 24:
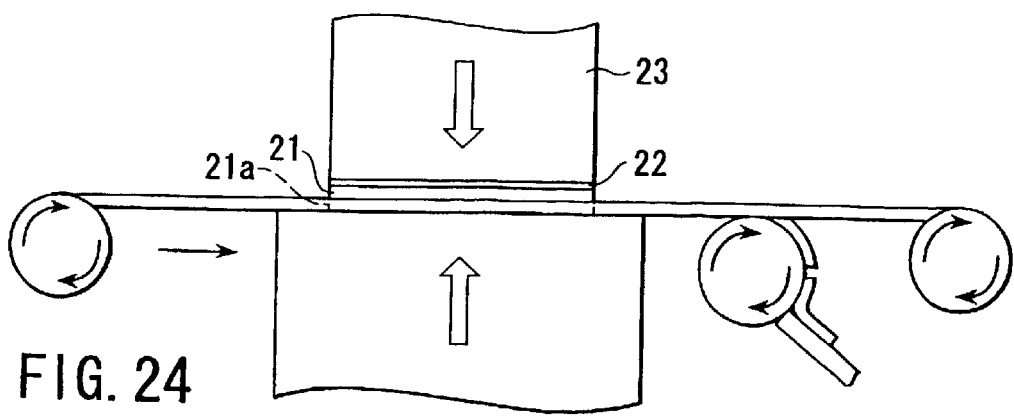
FIG. 24 is a view illustrating a circuit forming method by punching which is a modification of the circuit forming step in the FPC manufacturing process.

In the above step 45, a magnet cylinder 4 with a die is used to cut a conductive patter on a copper foil 2 and a bridge. However, as shown in FIG. 24, Thomson die 21 with a Thomson cutter 21a may be used for the cutting. In this case, a Thomson die 21 is mounted on a die mounter 22 of a press machine (not shown), and a copper foil 2 is cut by press work. The Thomson die 21 is the same as that described above, and the description is omitted here. Steps following step 10 are basically the same as those explained above, and the description is also omitted here.

Figure 25:
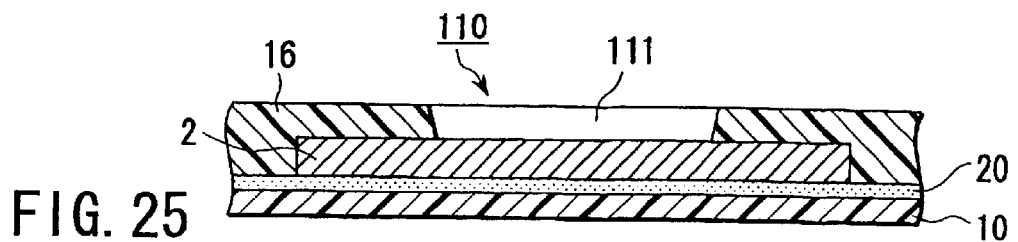
FIG. 25 is a sectional view showing a land formed by a method of forming a land of a flexible printed circuit board (FPC) according to one embodiment of the invention.
Figure 26:
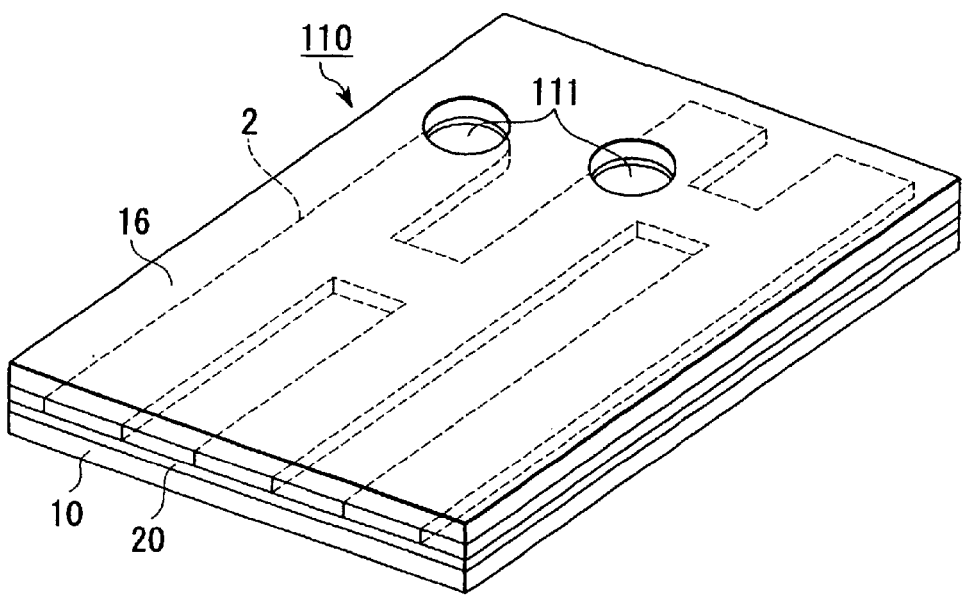
FIG. 26 is a perspective view showing a part of FPC with said land formed therein.

FIG. 25 is a section view showing a land formed by a method of forming a land of a flexible printed circuit board according to another embodiment of the invention. FIG. 26 is a perspective view showing a part of a flexible printed circuit board with a land formed therein.

As shown in FIG. 25 and FIG. 26, a copper foil 2 is laminated on a base film 10 through adhesive 20 inserted there-between, and a cover lay 16 comprising hot melt resin is formed on the copper foil 2. At a predetermined position of FPC 110 formed in this way, a land 111 is formed as a hole to expose the copper foil 2 to the cover lay 16 side by removing the cover lay 16. A base film 10 is formed by insulating resin film made of polyethylene terephtalate (PET) or polyethylene naphtalate (PEN), for example. Adhesive 20 is made of hot melt resin of polyurethane, polyester, polyamide or polyolefin group or thermoplastic resin adhesive of 1 or 2 liquid. A copper foil 2 is made of rolled copper foil or electroplated copper foil. A cover lay 16 may be made of a cover lay film or resist ink of UV hardening or heat-setting type and the like.

Figure 27:
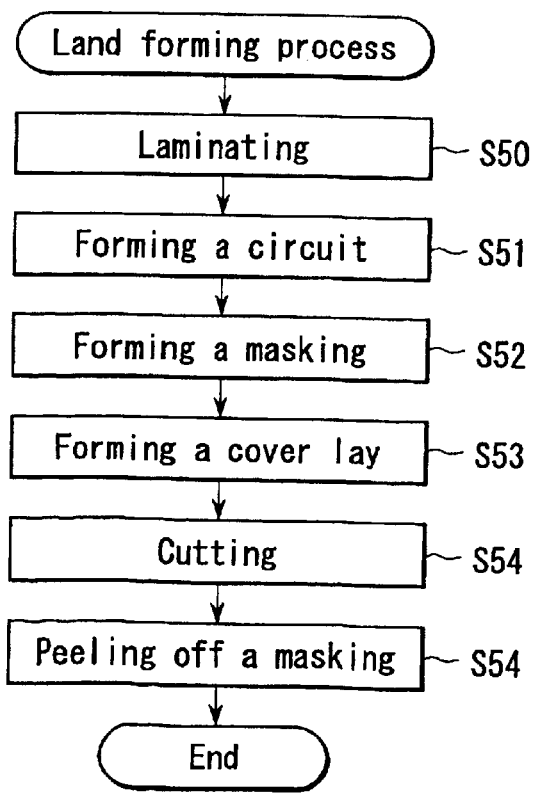
FIG. 27 is a flow chart showing a land forming process which is a part of a method of manufacturing a flexible printed circuit board (FPC) according to one embodiment of the invention.

FIG. 27 is a flow chart showing a process of manufacturing a flexible printed circuit board (FPC) including a land forming process according to an embodiment of the invention. FIGS. 28–34 are sectional vies explaining the steps of the land forming process of FIG. 27.

Figure 28:
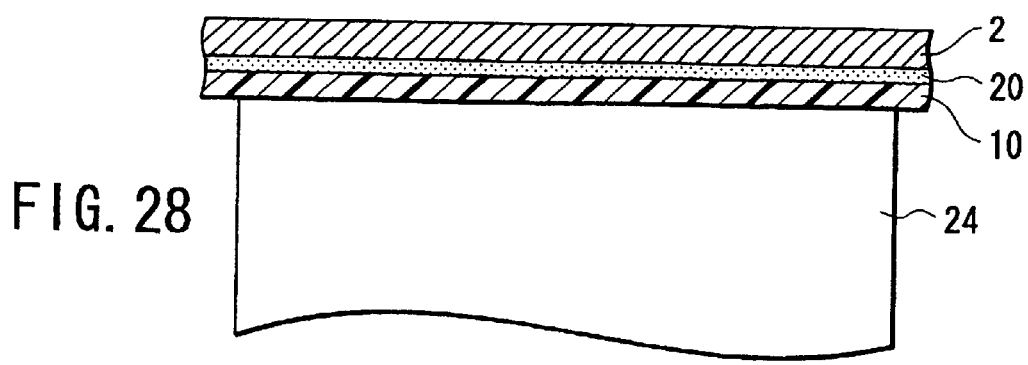
FIG. 28 is a sectional view explaining a step of said land forming process.
Figure 29:
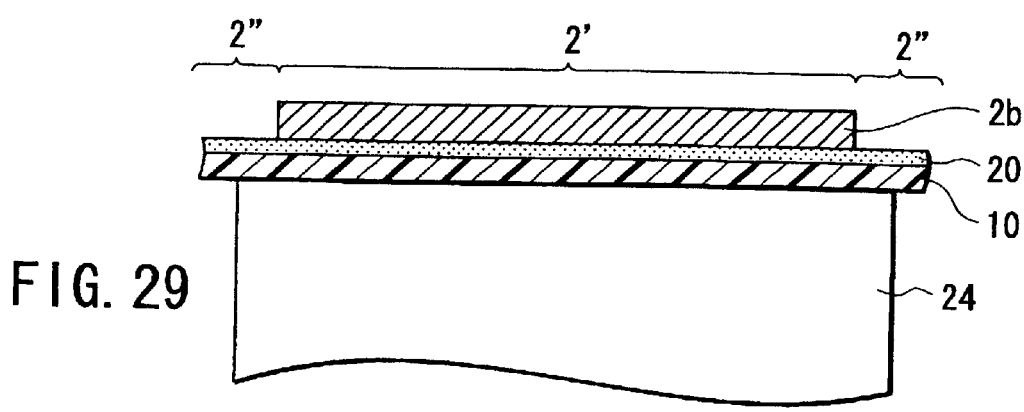
FIG. 29 is a sectional view explaining another step of the land forming process.

First, as shown in FIG. 28, a copper foil 2 is laminated on a base film 10 through an adhesive 20 inserted there-between (S50), and placed on a work table 24, for example. Next, as shown in FIG. 29, a circuit 2b comprising a predetermined conductive pattern is formed by eliminating a portion 2" except a conductive pattern forming part 2' of the copper foil 2 from the base film 10 by etching, for example (S51).

Figure 30:
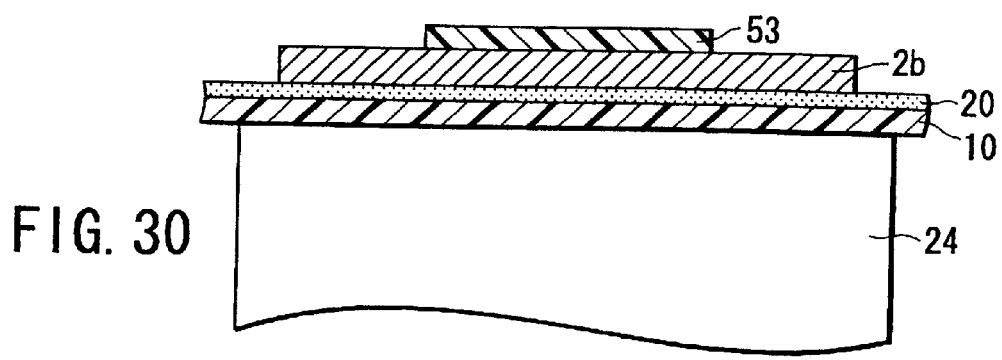
FIG. 30 is a sectional view explaining another step of the land forming process.

After the circuit 2b is formed, as shown in FIG. 30, a masking is formed on a desired land forming part on the circuit 2b by coating or printing a masking material 53 (S52). As a masking material 53, masking ink of UV hardening or heat-setting type or a masking tape made of paper or heat-resistant resin can be used. When masking ink is used, a masking material 53 can be coated on a circuit 2b by screen printing, for example, and the masking can be formed at low cost. When a masking tape is used, a masking material 53 can be automatically adhered onto a circuit 2b, and the masking can also be formed at low cost.

Figure 31:
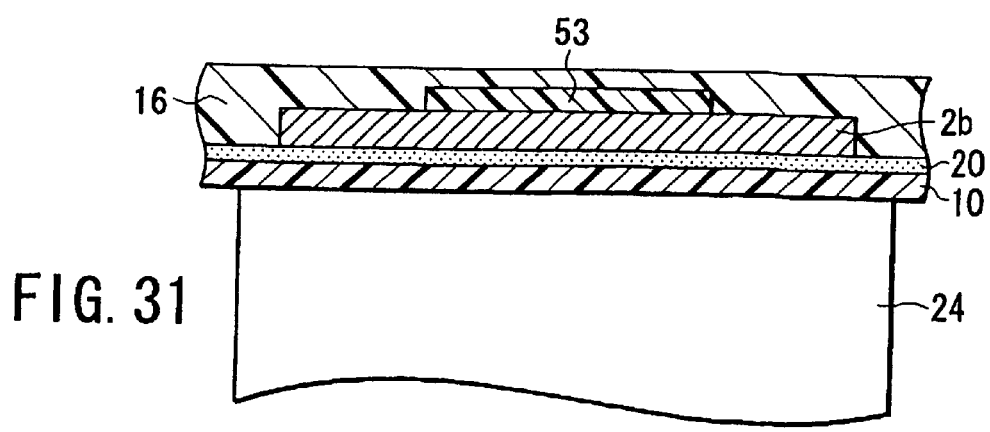
FIG. 31 is a sectional view explaining another step of the land forming process.

After the masking is formed in this way, as shown in FIG. 31, a cover lay 16 is formed on the base film 10 (including the adhesive material 20, circuit 2b and masking material 53) of FPC 110, by coating, drying and hardening a hot melt resin, for example (S53). As a hot melt resign, a hot melt resign of polyamide, polyurethane, polyester or polyolefin group is preferable. A cover lay 16 can be formed by using such a hot melt resign at low cost with the equivalent reliability as that formed by laminating another cover lay film (not shown) or printing resist ink (not shown).

Figure 32:
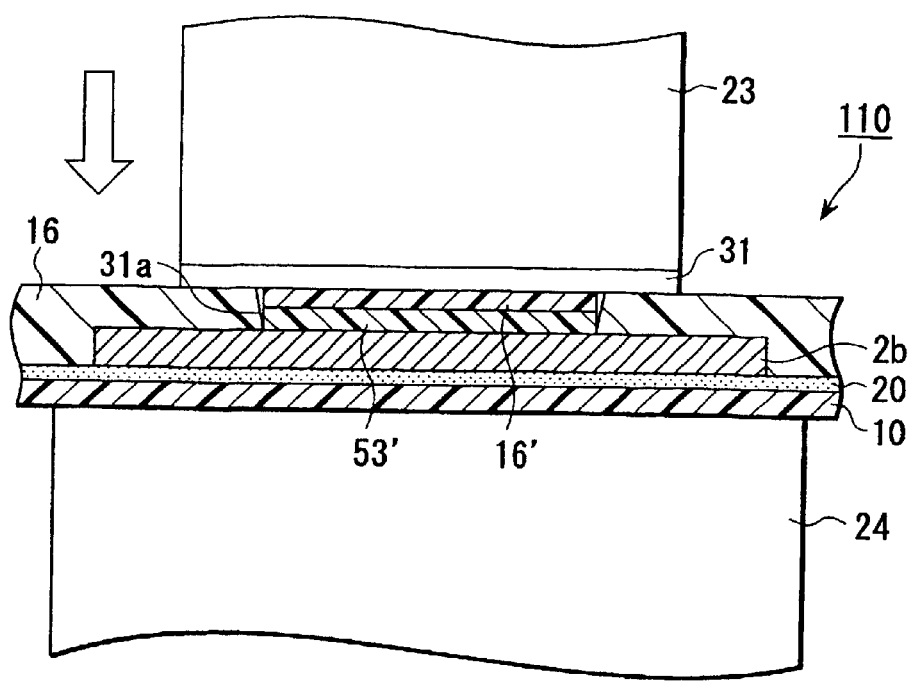
FIG. 32 is a sectional view explaining another step of the land forming process.

After the cover lay 16 is formed in step 53, as shown in FIG. 32, a work head 23 of a press machine (not shown) is moved in the outline arrow direction to cut, with a die 31, only the masking material 53' of the masking material forming part (namely, the part to form a land) and the cover lay 16' of FPC 110 (S54). The die 31 is, for example, Thomson die or pinnacle die, and has a cutter 31a comprising at least one of a projection and projected stripe to fit a land to be formed. Such a die can be manufactured at relatively low cost, and a land can be formed at low cost by using such a die. It is also possible to make a circuit 2b not by etching, but by cutting a copper foil 2 to a predetermined conductive pattern by using such a die 31.

Figure 33:
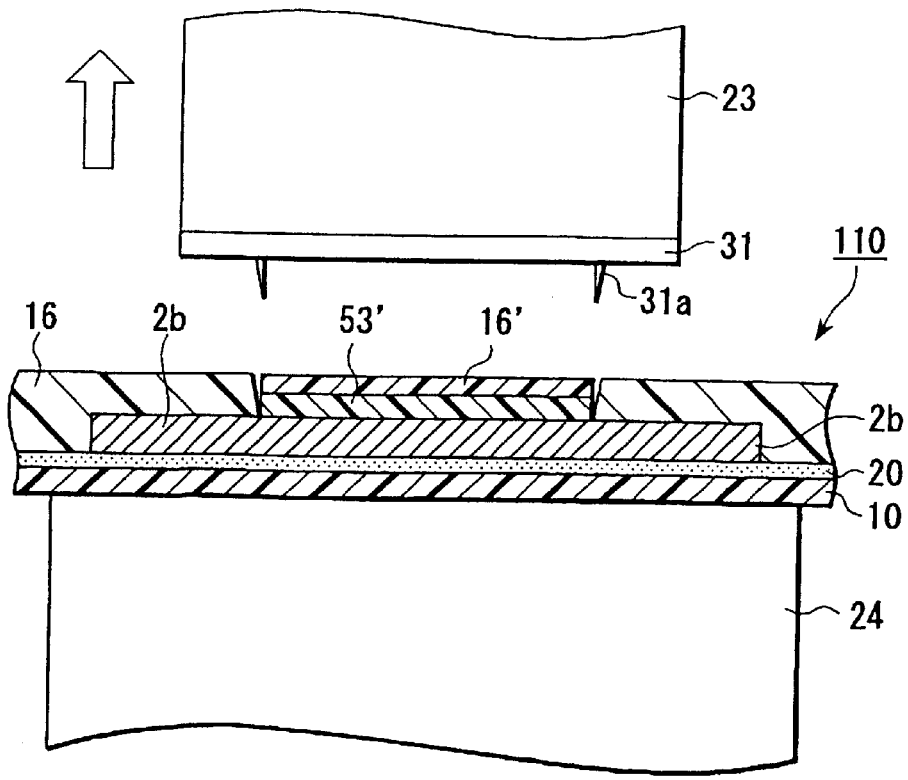
FIG. 33 is a sectional view explaining another step of the land forming process.
Figure 34:
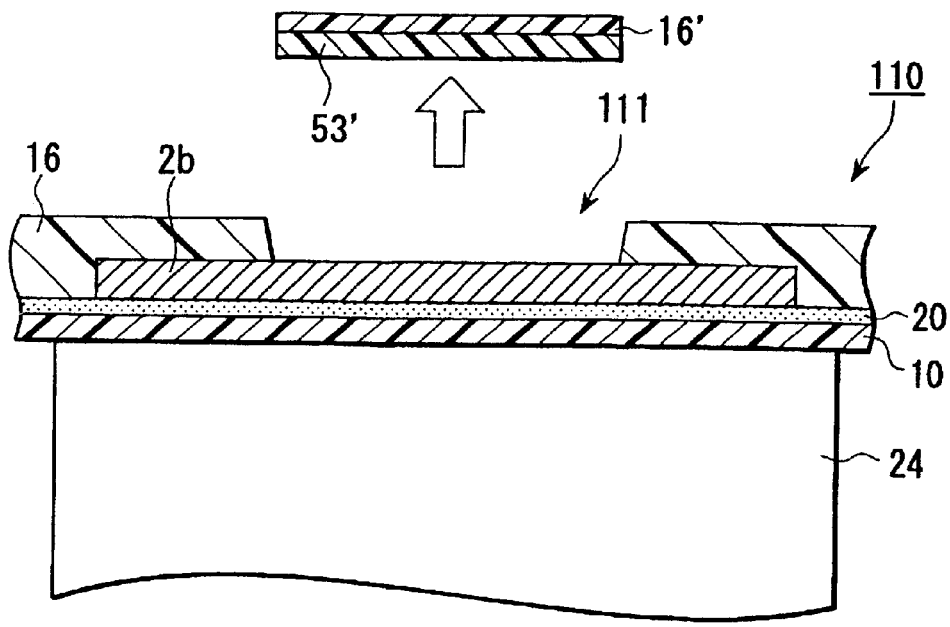
FIG. 34 is a sectional view explaining another step of the land forming process.
Figure 35A:
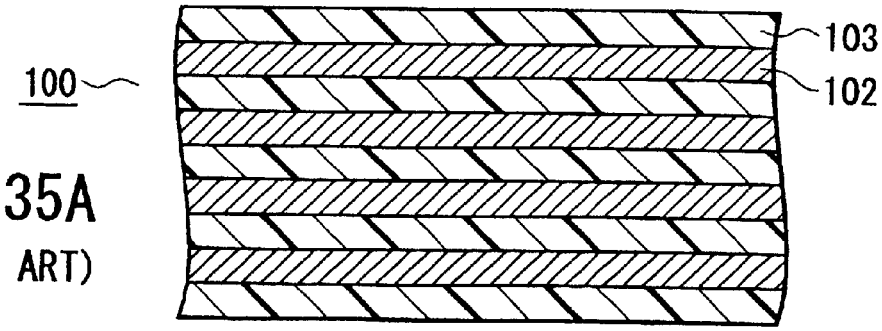
FIGS. 35A to 35C respectively shows a plane view, a transverse sectional view and a longitudinal sectional view of a flexible printed circuit board.
Figure 35B:
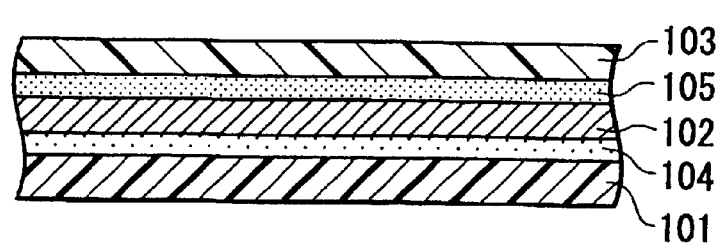
Figure 35C:
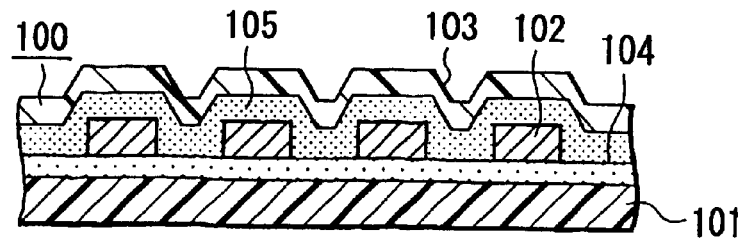
Figures 36, 37:
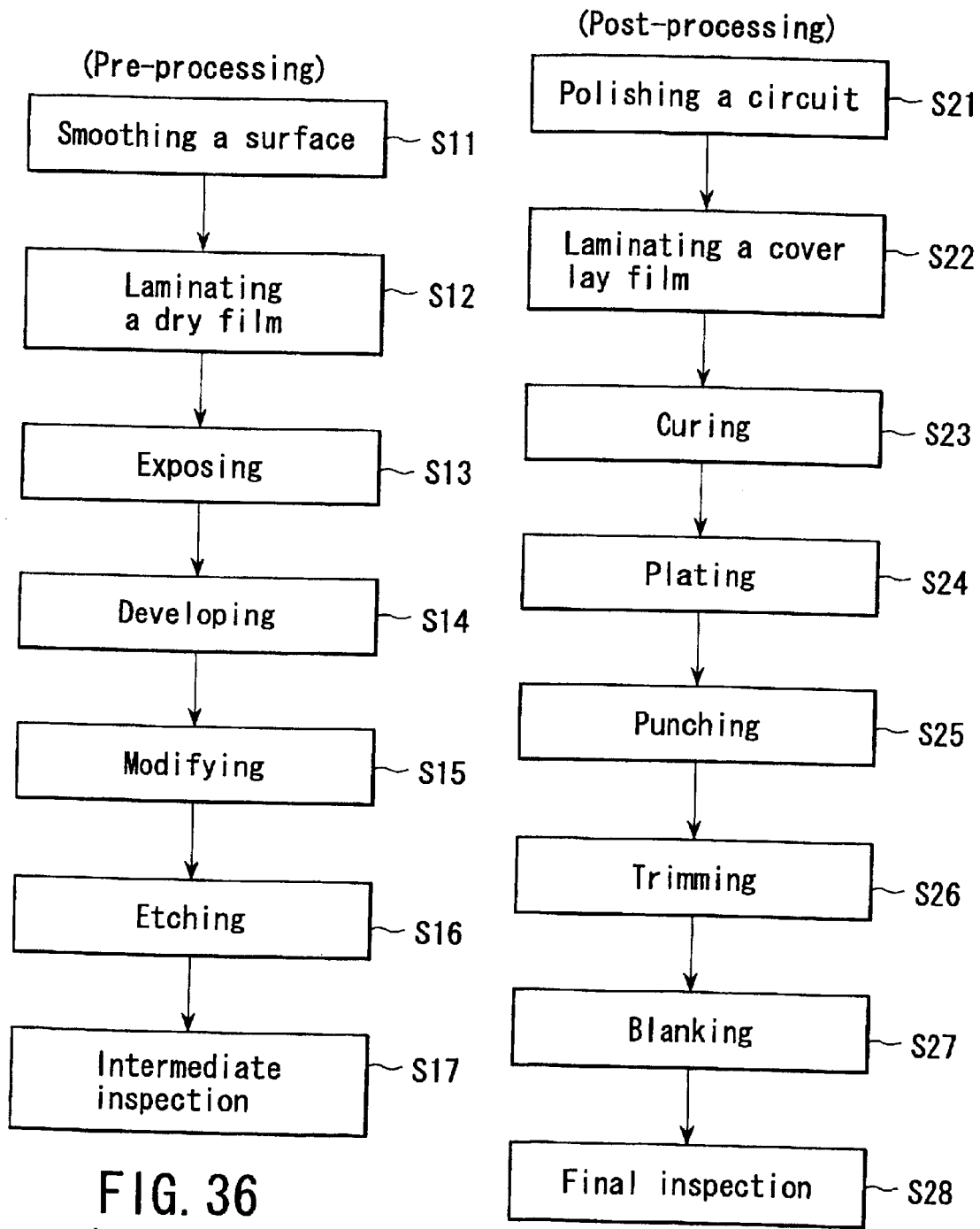
FIG. 36 is a flow chart showing a pre-process in a prior art method of manufacturing a flexible printed circuit board.
FIG. 37 is a flow chart showing a post-process in a prior art method of manufacturing a flexible printed circuit board.
Figure 38:
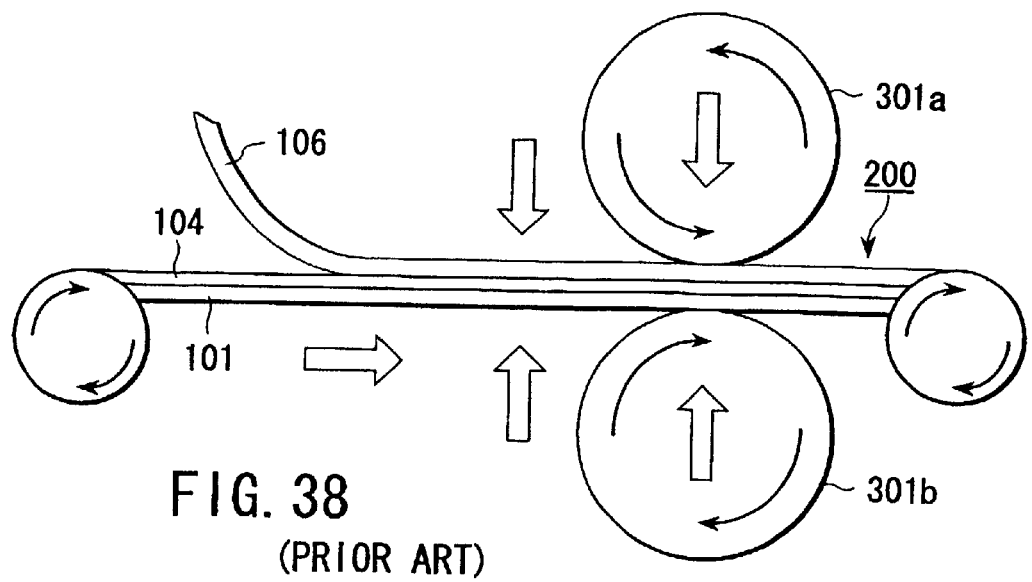
FIG. 38 is a schematic side view explaining a step of a prior art method of manufacturing a flexible printed circuit board.
Figure 39:
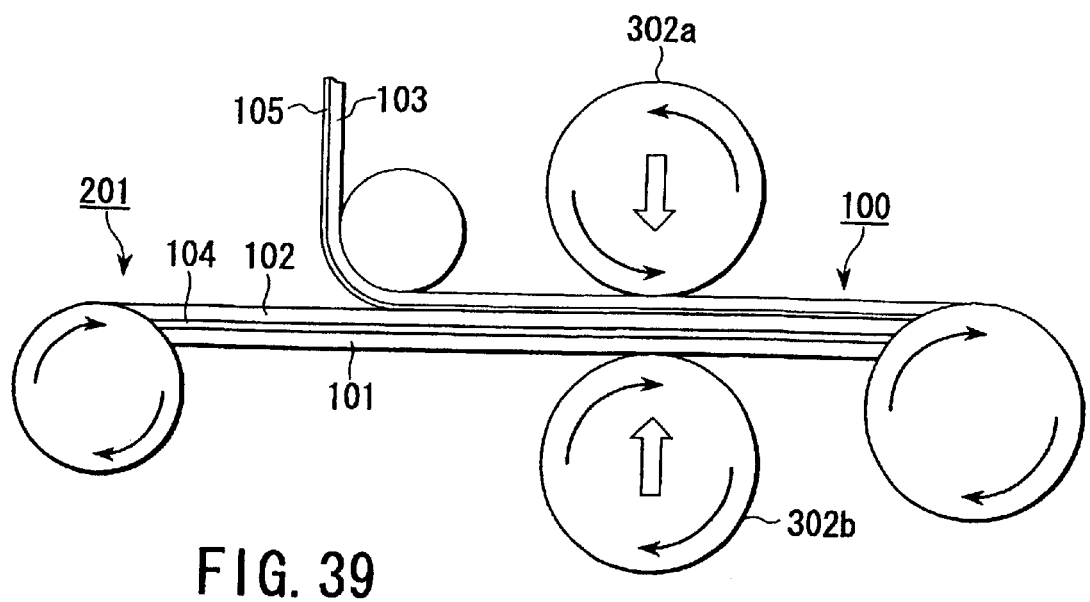
FIG. 39 is a schematic side view explaining another step of said prior art manufacturing method.
Figure 40A:
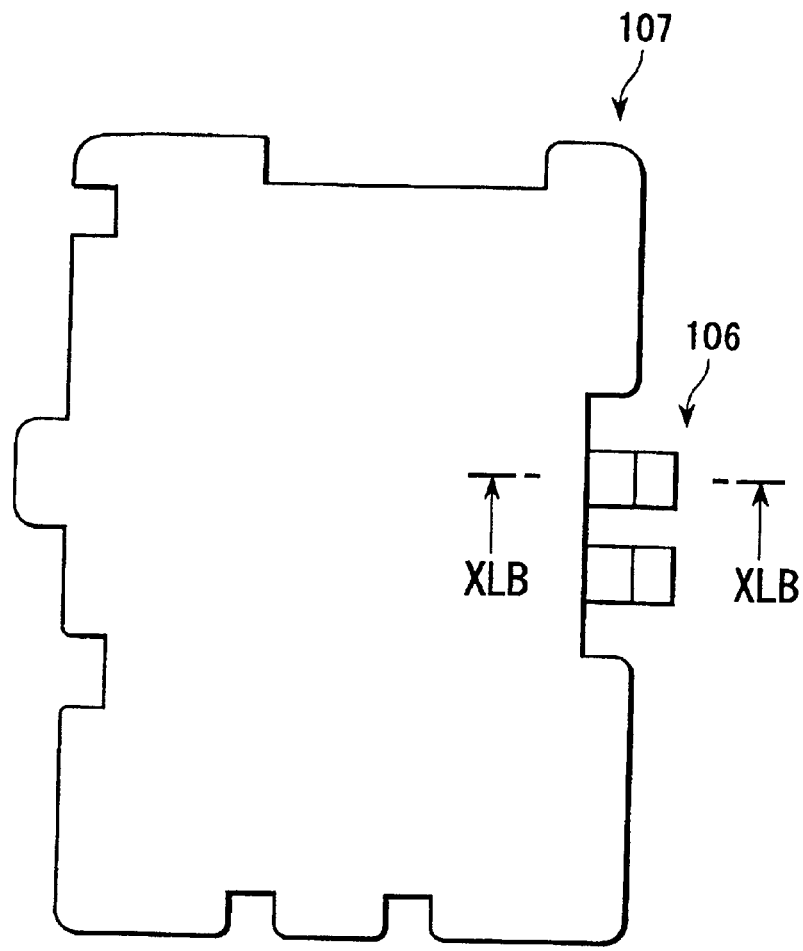
FIGS. 40A and 40B shows views illustrating a prior art interlayer connection of a multilayer wiring board.
Figure 40B:
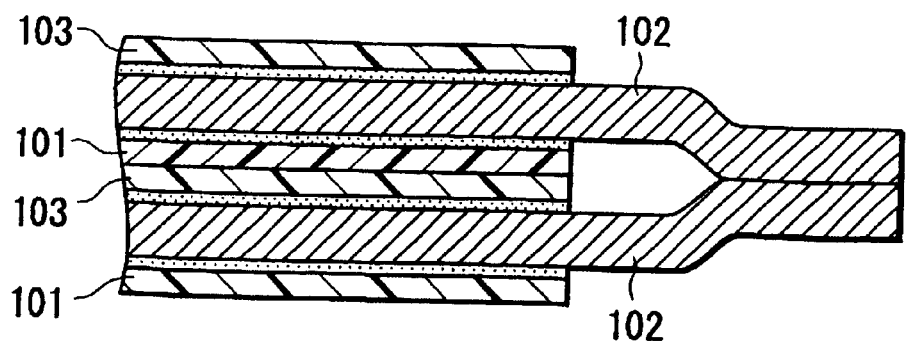

After cutting only the masking material 53' and cover lay 16' of the land forming part, the work head 23 is moved again in the outline arrow direction to separate from the FPC 110, as shown in FIG. 33. Finally, as shown in FIG. 34, the masking material 53' and cover lay 16' are stripped off from the FPC 110 as indicated by the outline arrow (S55), whereby a land 111 is formed as a hole to expose a part of the circuit 2b. The land 111 can be formed in various shapes depending on the shape of the masking formed on the circuit 2b or the shape of the cutter 31a of the die 31.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An interlayer connection structure of a multilayer wiring board comprising:
   a plurality of laminated flexible printed circuit boards, each having a base material and
   a conductive pattern made of copper foil formed on said base material; and
   a hole formed at a predetermined position in each of said base materials to expose a part of each of said conductive patterns to form a land;
   wherein
      said plurality of flexible printed circuit boards are laminated to align lands of respective circuit boards; and
      each of said exposed lands are directly connected to each other to connect said conductive patterns of each of said flexible printed circuit boards.

* * * * *